United States Patent [19]

Chao

[11] Patent Number: 5,811,332
[45] Date of Patent: Sep. 22, 1998

[54] METHOD OF FABRICATING A CAPACITOR STRUCTURE FOR A SEMICONDUCTOR MEMORY DEVICE

[75] Inventor: Fang-Ching Chao, Hsinchu, Taiwan

[73] Assignee: United Microeletronics Corp., Hsinchu, Taiwan

[21] Appl. No.: 757,676

[22] Filed: Nov. 29, 1996

[30] Foreign Application Priority Data

Aug. 16, 1996 [TW] Taiwan .................................. 85109995

[51] Int. Cl.$^6$ .............................................. H01L 21/8242
[52] U.S. Cl. .......................... 438/253; 438/254; 438/396; 438/397; 148/DIG. 14
[58] Field of Search ..................................... 438/239, 253, 438/254, 255, 256, 381, 396, 397, 398, 399; 148/DIG. 14

[56] References Cited

U.S. PATENT DOCUMENTS

| | | |
|---|---|---|
| 5,071,783 | 12/1991 | Taguchi et al. . |
| 5,077,688 | 12/1991 | Kumanoya et al. . |
| 5,089,869 | 2/1992 | Matsuo et al. . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |
| 5,164,337 | 11/1992 | Ogawa et al. . |
| 5,172,201 | 12/1992 | Suiza . |
| 5,196,365 | 3/1993 | Gotou . |
| 5,206,787 | 4/1993 | Fujioka . |
| 5,266,512 | 11/1993 | Kirsch . |

(List continued on next page.)

FOREIGN PATENT DOCUMENTS

| | | |
|---|---|---|
| 5-21745 A | 1/1991 | Japan . |
| 4-26156 | 1/1992 | Japan . |
| 5-251657 | 9/1993 | Japan . |
| 6-151748 | 5/1994 | Japan . |
| 2 252 447 | 8/1992 | United Kingdom . |

OTHER PUBLICATIONS

"Mini–Trenches in Polysilicon For Dram Storage Capacitance Enhancement", IBM Technical Disclosure Bulletin, vol. 33, No. 9, Feb. 1991.

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical papers. pp. 69–70.

Primary Examiner—Tuan H. Nguyen
Attorney, Agent, or Firm—Rabin & Champagne, P.C.

[57] ABSTRACT

Fabricating a semiconductor memory device on a substrate having a transfer transistor formed thereon includes forming a first insulating layer over the transfer transistor, an etching protection layer over the first insulating layer, a second insulating layer over the etching protection layer, and a stacked layer over the second insulating layer, wherein the stacked layer has a recess therein disposed above a source/drain region of the transistor and exposing a portion of the second insulating layer. A third insulating layer is formed around the periphery of the recess and a fourth insulating layer is formed to fill the recess. Then the process includes removing the third insulating layer and the fourth insulating layer from the recess, and a portion of the second insulating layer directly below the third insulating layer to form a cavity which does not expose the etching protection layer. A first conductive layer is then formed to fill the recess and the cavity, followed by removing the stacked layer. A fifth insulating layer is formed above the second insulating layer and the first conductive layer and a second conductive layer is formed over the fifth insulating layer, the second conductive layer penetrating the fifth insulating layer, the first conductive layer, the second insulating layer, the etching protection layer, and the first insulating layer, and being in electrical contact with the source/drain region. The second and fifth insulating layers are removed and a dielectric layer, a third conductive layer are formed on exposed surfaces of at least the first and second conductive layers.

40 Claims, 15 Drawing Sheets

U.S. PATENT DOCUMENTS

| | | |
|---|---|---|
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |
| 5,389,568 | 2/1995 | Yun . |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,478,770 | 12/1995 | Kim . |
| 5,508,222 | 4/1996 | Sakao . |
| 5,521,419 | 5/1996 | Wakamiya et al. . |
| 5,523,542 | 6/1996 | Chen et al. . |
| 5,550,080 | 8/1996 | Kim ......................................... 438/397 |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |
| 5,721,168 | 2/1998 | Wu ........................................... 438/253 |

METHOD OF FABRICATING A CAPACITOR STRUCTURE FOR A SEMICONDUCTOR MEMORY DEVICE

BACKGROUND OF THE INVENTION

1. Field of the Invention

The invention relates in general to semiconductor memory devices, and more particularly to a method of fabricating a dynamic random access memory (DRAM) cell having a transfer transistor and a charge storage capacitor.

2. Description of the Related Art

FIG. 1 is a circuit diagram of a conventional memory cell for a DRAM device. As shown in the drawing, a DRAM cell is substantially composed of a transfer transistor T and a charge storage capacitor C. A source terminal of the transfer transistor T is connected to a corresponding bit line BL, and a drain terminal thereof is connected to a storage electrode 6 of the charge storage capacitor C. A gate terminal of the transfer transistor T is connected to a corresponding word line WL. An opposing electrode 8 of the capacitor C is connected to a constant power source. A dielectric film 7 is provided between the storage electrode 6 and the opposing electrode 8 of the capacitor C.

In the conventional DRAM manufacturing process, a substantially two-dimensional capacitor called a planar type capacitor is mainly used for conventional DRAM devices having a storage capacity less than 1 Mb (megabytes). In the case of a DRAM having a memory cell using a planar type capacitor, electric charges are stored on electrodes disposed on the main surface of a semiconductor substrate, so that the main surface is required to have a relatively large area. This type of a memory cell is therefore not suitable for a DRAM having a high degree of integration. For a high integration DRAM, such as a DRAM with more than 4 Mb of memory, a three-dimensional capacitor structure, called a stacked-type or a trench-type capacitor, has been introduced.

With stacked-type or trench-type capacitors, it has been possible to obtain a larger memory for a similar surface area. However, to realize a semiconductor device of an even higher degree of integration, such as a very-large-scale integration (VLSI) circuit having a capacity of 64 Mb, a capacitor with a simple three-dimensional structure, such as the conventional stacked-type or trench-type, turns out to be insufficient.

One solution for improving the capacitance of a DRAM memory cell capacitor is to use the so-called fin-type stacked capacitor, an example of which is proposed by Ema et al., in "3-Dimensional Stacked Capacitor Cell for 16 M and 64 M DRAMs", International Electron Devices Meeting, pp. 592–595, Dec. 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.); 5,126,810 (Gotou); 5,196,365 (Gotou); and 5,206,787 (Fujioka).

Another solution for improving the capacitance of a memory cell capacitor is to use the so-called cylindrical-type stacked capacitor, an example of which is proposed by Wakarniya et al., in "Novel Stacked Capacitor Cell for 64-Mb DRAM", 1989 Symposium on VLSI Technology, Digest of Technical Papers, pp. 69–70. The cylindrical-type stacked capacitor includes electrodes and dielectric films which extend in a cylindrical shape to increase the surface areas of the electrodes. A DRAM memory cell having the cylindrical-type stacked capacitor is also disclosed in U.S. Pat. No. 5,077,688 (Kumanoya et al.).

With the trend toward increased integration density, the size of the DRAM cell in a plane (the surface area it occupies in a plane) must be further reduced. Generally, a reduction in the size of the conventional cell leads to a reduction in charge storage capacity (capacitance) of the conventional capacitors. Additionally, as the capacitance is reduced, the likelihood of soft errors arising from the incidence of ($\alpha$-rays is increased. Therefore, there is a need in this field for a new storage capacitor structure which, while occupying a smaller area in a plane, can maintain the same capacitance, and a suitable method of fabricating the structure.

SUMMARY OF THE INVENTION

It is therefore an object of the invention to provide a method of fabricating a semiconductor memory device having a tree-type capacitor structure that provides an increased area for charge storage without increasing the device surface area used.

In accordance with the foregoing and other objects of the invention, a new and improved method of fabricating a semiconductor memory device is provided.

According to one preferred embodiment of the invention, the semiconductor memory device includes a substrate, a transfer transistor formed on the substrate, and a storage capacitor electrically connected to a source/drain region of the transfer transistor. The method includes: forming a first insulating layer over the transfer transistor, forming an etching protection layer over the first insulating layer, forming a second insulating layer, forming a stacked layer on the second insulating layer, wherein the stacked layer has a recess therein exposing the second insulating layer, forming a third insulating layer at a periphery of the recess, forming a fourth insulating layer to fill the recess, removing the third insulating layer, the fourth insulating layer and a portion of the second insulating layer directly below the third insulating layer to form an opening, wherein the opening does not expose the etching protection layer, forming a first conductive layer to fill the recess and the opening, removing the stacked layer, forming a fifth insulating layer, forming a second conductive layer over the fifth insulating layer, wherein the second conductive layer penetrates at least the fifth insulating layer, the first conductive layer, the second insulating layer, the etching protection layer, and the first insulating layer, and is electrically connected to the drain region, removing a portion of the second conductive layer to form a trunk-like conductive layer, wherein the first conductive layer forms a branch-like conductive layer, and the trunk-like and branch-like conductive layers together form a storage electrode of the storage capacitor, removing the second and fifth insulating layers, forming a dielectric layer on exposed surfaces of the first and second conductive layers, and forming a third conductive layer on a surface of the dielectric layer to form an opposing electrode.

According another aspect of the invention, the trunk-like conductive layer is an integrated element and electrically connected to the source/drain region. The cross section of the trunk-like conductive layer can be either T-shaped or solid cylinder-like.

According to another aspect of the invention, several steps are further included after the stacked layer is removed and before the fifth insulating layer is formed. The additional steps are: forming a sixth insulating layer and then forming a fourth insulating layer on the sixth insulating layer. Accordingly, the second conductive layer is formed to penetrate the fourth conductive layer and the six insulating layer. The fourth conductive layer is also patterned to be a part of the branch-like conductive layer. The six insulating layer is then removed. The dielectric film is further formed on an exposed surface of the fourth conductive layer.

According to another aspect of the invention, a chemical mechanical or etching technique is utilized to remove a portion of the second conductive layer on the fifth insulating layer.

According to another aspect of the invention, the step of forming the second insulating layer through the step of removing the stacked layer are repeated for at least once before the fifth insulating layer is formed. Consequently, at least two branch-like conductive layers are formed.

According to another preferred embodiment of the invention, a method of fabricating a semiconductor memory device is provided. The semiconductor memory device includes a substrate, a transfer transistor formed on the substrate, and a storage capacitor electrically connected to a source/drain region of the transfer transistor. The method includes: forming a first insulating layer over the transfer transistor, forming a first conductive layer which penetrates at least the first insulating layer and is electrically connected to the source/drain region, forming a second insulating layer, forming a stacked layer, having a recess therein which exposes the second insulating layer, forming a third insulating layer at a periphery of the recess, forming a fourth insulating layer to fill the recess, removing the third, fourth insulating layers and a portion of the second insulting layer directly below the third insulating layer to form a opening, wherein the opening is in the second insulating layer but does not expose the first conductive layer, forming a second conductive layer to fill the recess and the opening, removing the stacked layer, forming a fifth insulating layer, forming a third conductive layer which penetrates at least the fifth insulating layer, the second conductive layer, and the second insulating layer to be electrically connected to the first conductive layer, patterning the first conductive layer to form a part of the trunk-like conductive layer, wherein the first and third conductive layers form the trunk-like conductive layer, the second conductive layer forms a branch-like conductive layer, and the trunk-like and branch-like conductive layers form a storage electrode of the storage capacitor, removing the second and fifth insulating layers, forming a dielectric layer on exposed surfaces of the first, second, third conductive layers, and forming a fourth conductive layer to form an opposing electrode of the storage capacitor.

According to another aspect of the latter preferred embodiment, steps of forming an etching protection layer on a first insulating layer and then forming a seventh insulating layer on the etching protection layer are further performed just after the first insulating layer is formed. Subsequently, the first conductive layer is formed to further penetrate the seventh insulating layer and the etching protection layer. The seventh insulating layer is removed before the dielectric layer is formed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

First Embodiment

FIGS. 2A through 2I are sectional diagrams depicting the steps involved in a method for fabricating a first preferred embodiment of the semiconductor memory device according to the invention.

Figure 1:
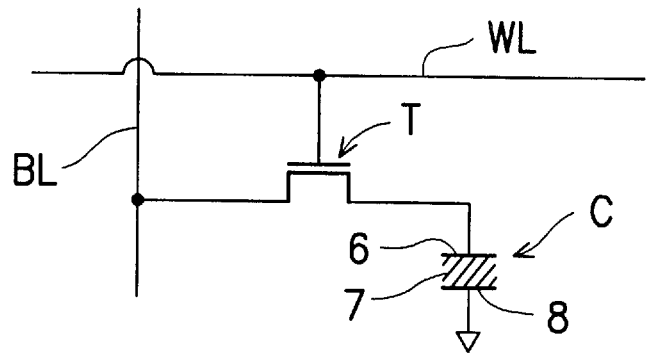
FIG. 1 is a schematic circuit diagram of a conventional memory cell of a DRAM device.
Figure 2A:
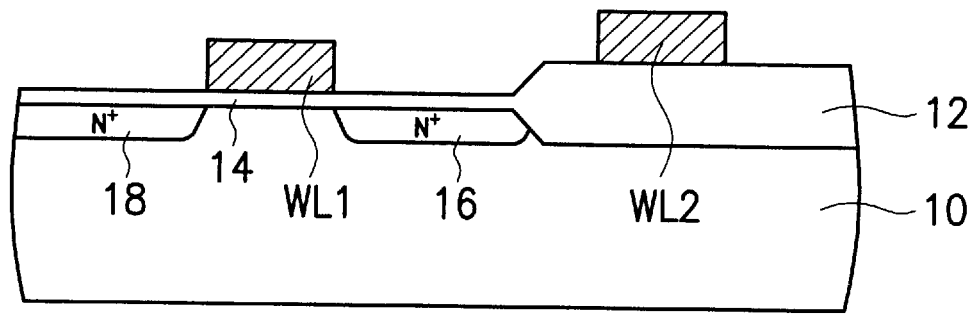
FIGS. 2A through 2I are cross-sectional views depicting process steps for fabricating a semiconductor memory cell having a tree-type capacitor according to a first embodiment of the invention.

Referring first to FIG. 2A, a silicon substrate 10 is subjected to thermal oxidation by the LOCOS (local oxidation of silicon) method to form a field oxidation film 12 having a thickness of, for example, about 3,000 Å (angstrom) over the silicon substrate 10. Subsequently, the silicon substrate 10 is again subjected to thermal oxidation to form a gate oxidation layer 14 having a thickness of about 150 Å, for example. After that, a polysilicon layer is deposited over the entire top surface of the silicon substrate 10 by chemical vapor deposition (CVD) or low pressure chemical vapor deposition (LPCVD), to a thickness, for example, of about 2,000 Å. Suitable impurities such as phosphorus ions can be diffused into the polysilicon layer to increase its conductivity. In addition, a refractory metal layer, for example, can be deposited over the polysilicon layer and then annealed to turn the polysilicon layer into polycide, to further increase the conductivity of the polysilicon layer. The refractory metal layer can be, for example, a layer of tungsten (W) deposited, for example, to a thickness of about 2,000 Å. A conventional photolithographic and etching process is then performed on the wafer to define and form over the wafer, polysilicon metallization layers, called word lines WL1 and WL2, which serve as gates, as illustrated in FIG. 2A. Subsequently, a drain region 16 and a source region 18 are formed in the silicon substrate 10, for example, by implantation of arsenic ions into selected regions on the silicon substrate 10. During this process, the word lines WL1 and WL2 serve as a mask for the implantation, and the arsenic ions are implanted, for example, with an energy of 70 KeV and a concentration of about $1 \times 10^{15}$ atoms/cm$^2$.

Figure 2B:
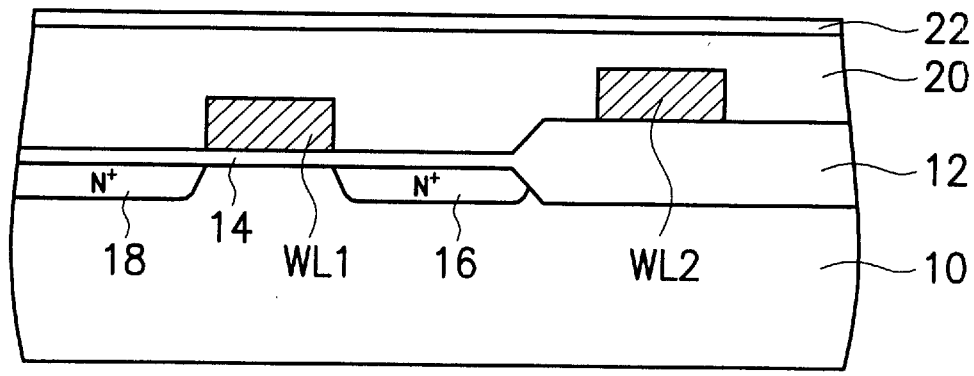

Referring next to FIG. 2B, in a subsequent step an insulating layer 20 such as borophosphosilicate glass (BPSG) is deposited over the entire wafer by chemical-vapor deposition (CVD) to a thickness of about 7,000 Å, for example. After that, the same CVD method is used to deposit an etching protection layer 22 such as a layer of silicon nitride, over the insulating layer 20 to a thickness of, for example, about 1,000 Å.

Figure 2C:
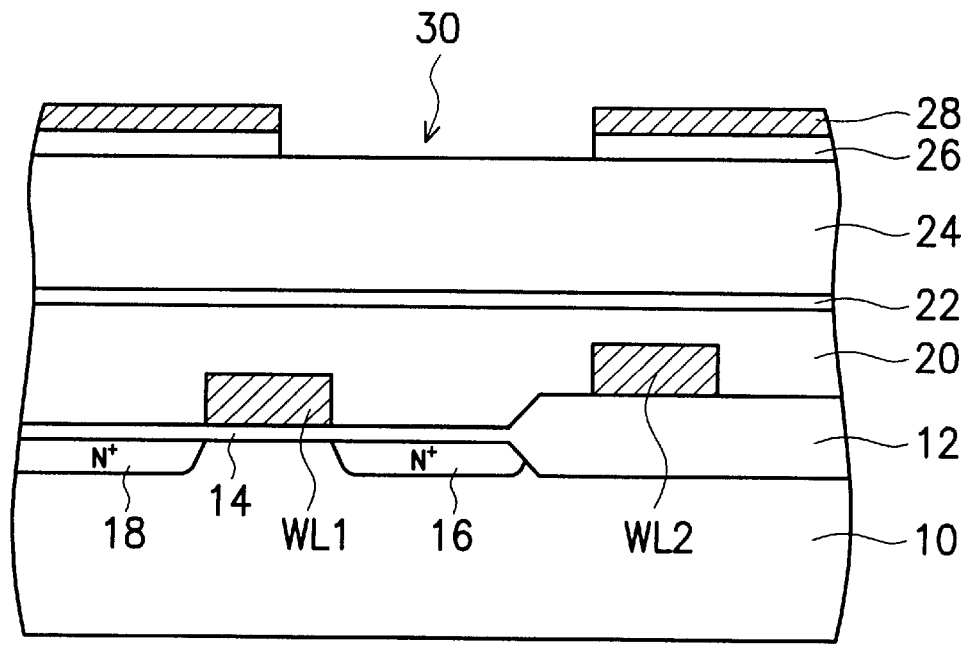

Referring to FIG. 2C, a thick layer 24 of insulating material, such as silicon dioxide, is deposited by the CVD method over the etching protection layer 22 to a thickness of, for example, about 7,000 Å. After that, an insulating layer and a sacrificial polysilicon layer are successively deposited over the insulating layer 24. Then, a conventional photolithographic and etching process is performed on the wafer, so as to remove selected parts of the insulating layer and the sacrificial polysilicon layer. The remaining part of the insulating layer is indicated by the reference numeral 26, and the remaining part of the sacrificial polysilicon layer is indicated by the reference numeral 28, in FIG. 2C. The insulating layer 26 can be, for example, silicon nitride deposited to a thickness of about, for example, 1,000 Å and the sacrificial polysilicon layer 28 is deposited to a thickness of about 1,000 Å, for example. The insulating layer 26 and sacrificial polysilicon layer 28 in combination form a stacked structure (26, 28) having a vertical recess 30 therein. The recess 30 is substantially aligned with the drain region 16 therebelow.

Figure 2D:
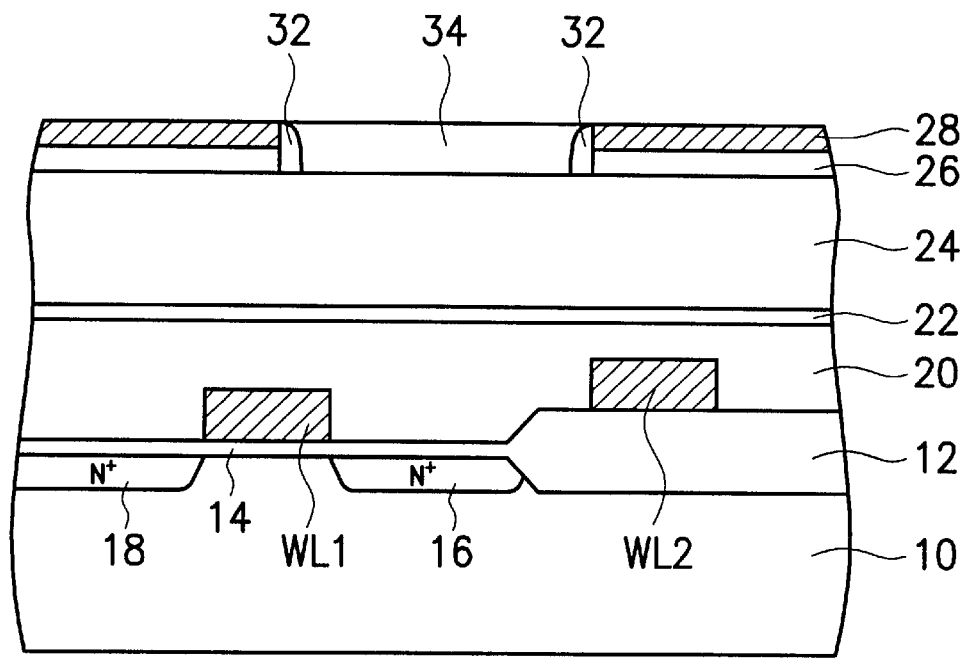

Referring next to FIG. 2D, in the subsequent step, silicon dioxide spacers 32 are formed on the sidewalls of the stacked structure (26, 28). In this embodiment, the silicon dioxide spacers 32 are formed by first depositing a layer of silicon dioxide to a thickness of, for example, about 1,000 Å, and then etching back the silicon dioxide layer. A layer 34 of an insulating material, such as silicon nitride, is then deposited over the wafer by CVD to a thickness of, for example, about 2,000 Å. The insulating layer 34 substantially fills the recess 30. Chemical mechanical polishing (CMP) is then performed on the top surface of the wafer, so as to polish away part of the insulating layer 34, until at least the top surface of the stacked structure (26, 28) is exposed.

Figure 2E:
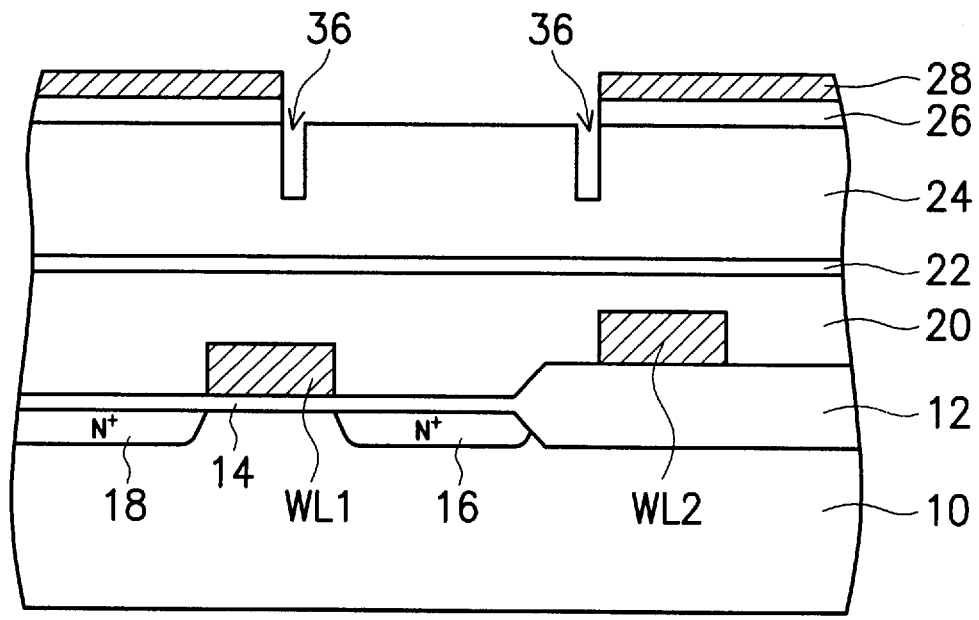

Referring to FIG. 2E, the stacked structure (26, 28) and the insulating layer 34 are next used together as an etching mask, while etching the wafer to remove the silicon dioxide spacers 32. After the silicon dioxide spacers 32 are completely removed, the etching process continues, still using the stacked structure (26, 28) and the insulating layer 34 as an etching mask, to etch away the portions of the insulating layer 24 that are located directly beneath the positions where the silicon dioxide spacers 32 were originally located. The etching is controlled to a predetermined depth to form cavities 36 in the insulating layer 24. It is to be noted that the depth of the cavities 36 can be arbitrarily adjusted but the bottoms of the cavities 36 should be some distance above the top surface of the etching protection layer 22. Subsequently, using the sacrificial polysilicon layer 28 as an etching mask, the wafer is etched to remove the insulating layer 34.

Figure 2F:
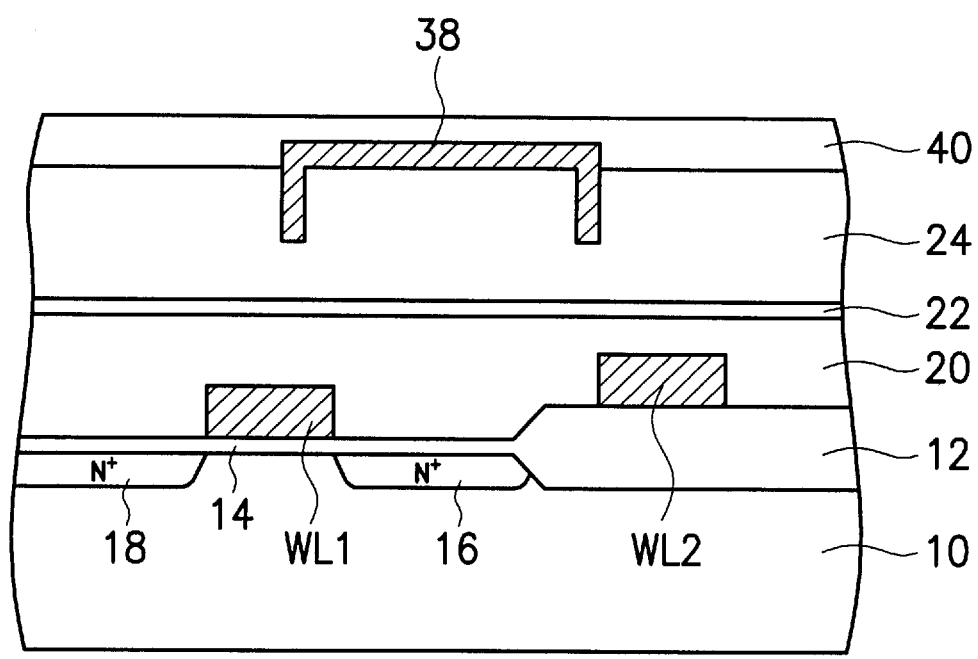

Referring next to FIG. 2F, a polysilicon layer 38 is then deposited over the stacked structure (26, 28) and the insulating layer 24 to a thickness of, for example, about 1,000 Å which substantially fills the cavities 36. The polysilicon layer 38 can be diffused with arsenic ions, for example, to increase the conductivity thereof. After that, CMP is performed on the wafer until at least the top surface of the insulating layer 26 is exposed. The remaining part of the polysilicon layer is indicated by the reference numeral 38 in FIG. 2F. The polishing also removes the sacrificial polysilicon layer 28. Then, using the polysilicon layer 38 and the insulating layer 24 together as an etching protection mask, wet etching is performed on the wafer so as to remove the insulating layer 26. The entire stacked structure (26, 28) is thus removed. An insulating layer 40, formed, for example, of silicon dioxide is then deposited over the wafer by CVD to a thickness of, for example, about 2,000 Å.

Figure 2G:
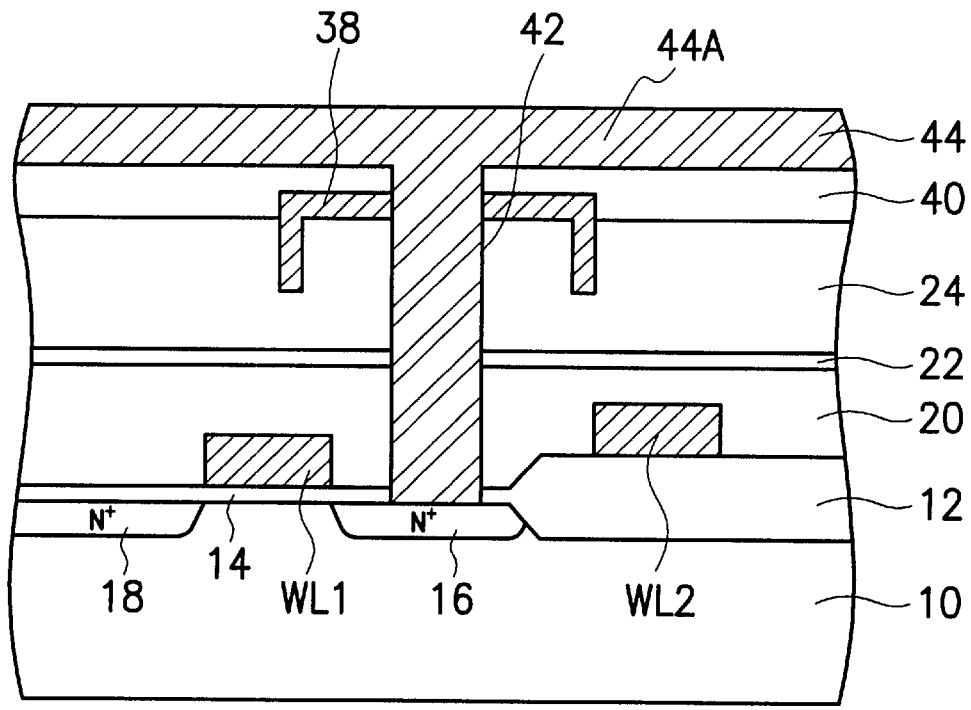

Referring to FIG. 2G, in a subsequent step, a conventional photolithographic and etching process is performed to form a storage electrode contact hole 42 through the insulating layer 40, the polysilicon layer 38, the insulating layer 24, the etching protection layer 22, the insulating layer 20, and the gate oxidation layer 14, to the top surface of the drain region 16. A polysilicon layer 44 is then deposited by CVD to fill the storage electrode contact hole 42 and cover the top surface of the insulating layer 40.

Figure 2H:
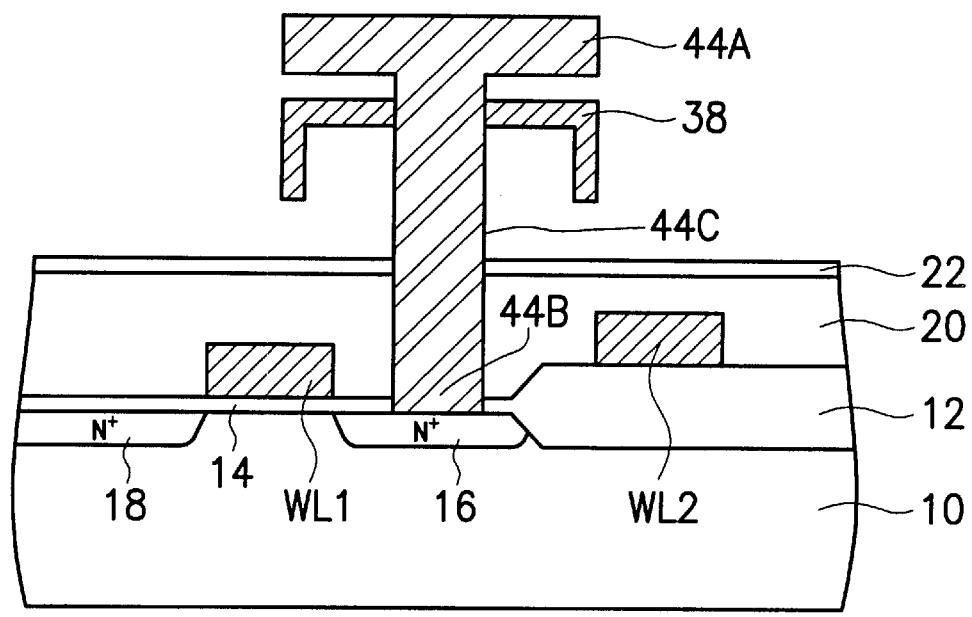

Referring next to FIG. 2H, a conventional photolithographic and etching process is next performed to define the storage electrode for the data storage capacitor of the DRAM cell that is to be formed. Then using the etching protection layer 22 as an etch end point, wet etching is performed on the wafer so as to entirely remove both the insulating layer 40 and the insulating layer 24. This completes the fabrication of the storage electrode for the data storage capacitor of the DRAM cell. As shown in the drawing, the storage electrode includes a trunk-like polysilicon layer 44 which is substantially T-shaped in cross section, and branch-like polysilicon layer sections 38 which are substantially L-shaped in cross section. The trunk-like polysilicon layer 44A has its root 44B (bottom end) electrically connected to the drain region 16 of the transfer transistor of the DRAM cell. The L-shaped branch-like polysilicon layer sections 38 branch out sideways from the upright portion 44A (perpendicular the upright portion 44C of the T-shaped trunk-like polysilicon layer 44A) and then extend downwards toward the substrate 10. Due to its particular overall and component shapes, the storage electrode is hereinafter referred to as a "tree-type storage electrode" in this specification and the data storage capacitor thus made is referred to as a "tree-type capacitor".

Figure 2I:
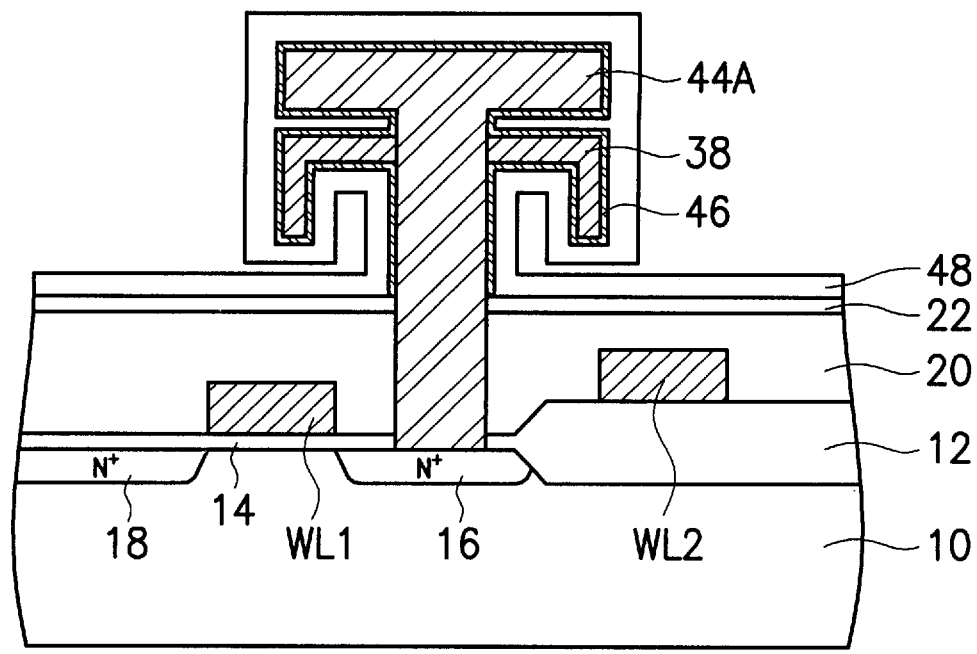

Referring further to FIG. 2I, in a subsequent step a dielectric layer 46, for example, of silicon dioxide, silicon nitride, NO (silicon nitride/silicon dioxide), ONO (silicon dioxide/silicon nitride/silicon dioxide), or the like, is formed over the exposed surfaces of both the trunk-like polysilicon layer 44A and the branch-like polysilicon layer sections 38. Next, to complete the fabrication of the tree-type capacitor, a layer of polysilicon 48 serving as an electrode opposed to the storage electrode (44A, 38), is formed over the dielectric layer 46. The process for forming the opposed electrode 48 includes a first step of depositing the polysilicon by CVD to a thickness of, for example, about 1,000 Å, a second step of diffusing N-type impurities into the polysilicon to increase the conductivity thereof, and a final step of performing a conventional photolithographic and etching process on the polysilicon to form the desired opposed electrode 48.

To complete fabrication of the DRAM cell, the subsequent steps include the fabrication of bit lines, bonding pads, interconnections, passivations, and packaging. These steps involve only conventional techniques so that a description thereof need not be provided herein.

Second Embodiment

In the foregoing first embodiment, each storage electrode includes only one L-shaped branch-like conductive layer having two sections. However, the invention is not limited to the use of just one set of L-shaped branch-like conductive layer sections. Two or more sets of L-shaped branch-like conductive layer sections can be provided. The second embodiment here has a storage electrode with two L-shaped, branch-like conductive layer sets.

FIGS. 3A through 3E are sectional views depicting the steps involved in a method for fabricating a second embodiment of the semiconductor memory device according to the invention, which device includes a tree-type capacitor storage electrode having two sets of L-shaped branches. The tree-type capacitor of the second embodiment is based on the structure of FIG. 2F. Elements in FIG. 3A through 3E that are identical in structure and purpose to those in FIG. 2F are labeled with the same reference numerals.

Figure 3A:
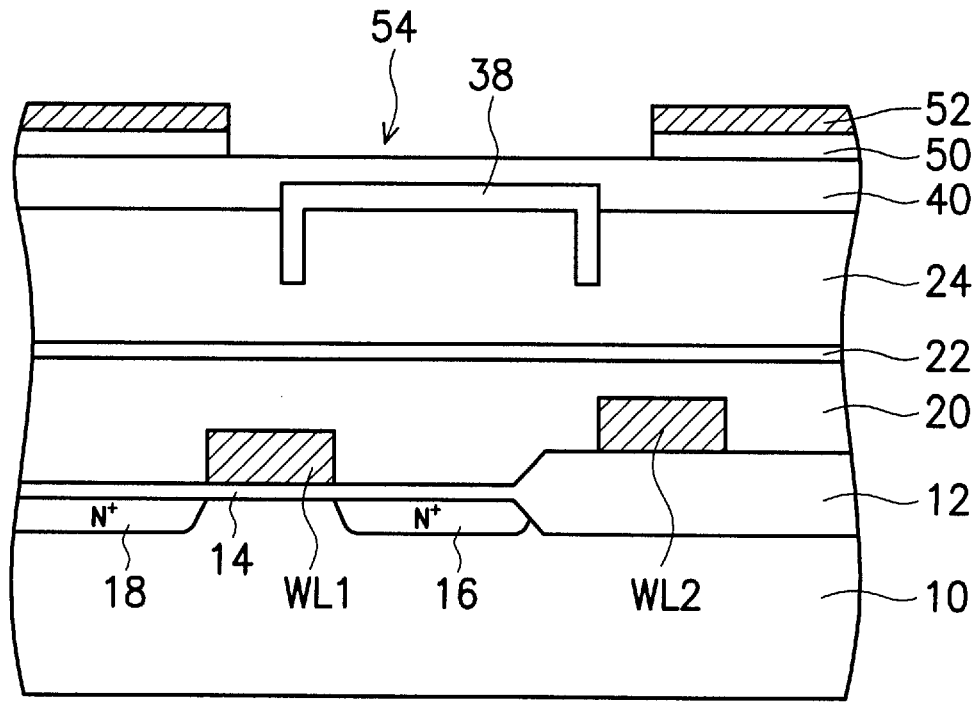
FIGS. 3A through 3E are cross-sectional views depicting process steps for fabricating a semiconductor memory cell having a tree-type capacitor according to a second embodiment of the invention.

Referring to FIG. 3A together with FIG. 2F, after producing the structure of FIG. 2F, an insulating layer and a sacrificial polysilicon layer are successively deposited over the insulating layer 40. Then a conventional photolithographic and etching process is performed to removed selected parts of both the insulating layer and the sacrificial layer. The remaining part of the insulating layer is indicated by the reference numeral 50, and the remaining part of the sacrificial polysilicon layer is indicated by the reference numeral 52 in FIG. 3A. The insulating layer 50 can be formed of silicon nitride deposited to a thickness of, for example, about 1,000 Å and the sacrificial polysilicon layer 52 is deposited to a thickness of, for example, about 1,000 Å. The insulating layer 50 and the sacrificial polysilicon layer 52, in combination, form a stacked structure (50, 52) having a recess 54 therein. The recess 54 here is larger in width than the recess 30 formed in the earlier performed steps shown in FIG. 2C, and is substantially aligned vertically with the drain region 16.

Figure 3B:
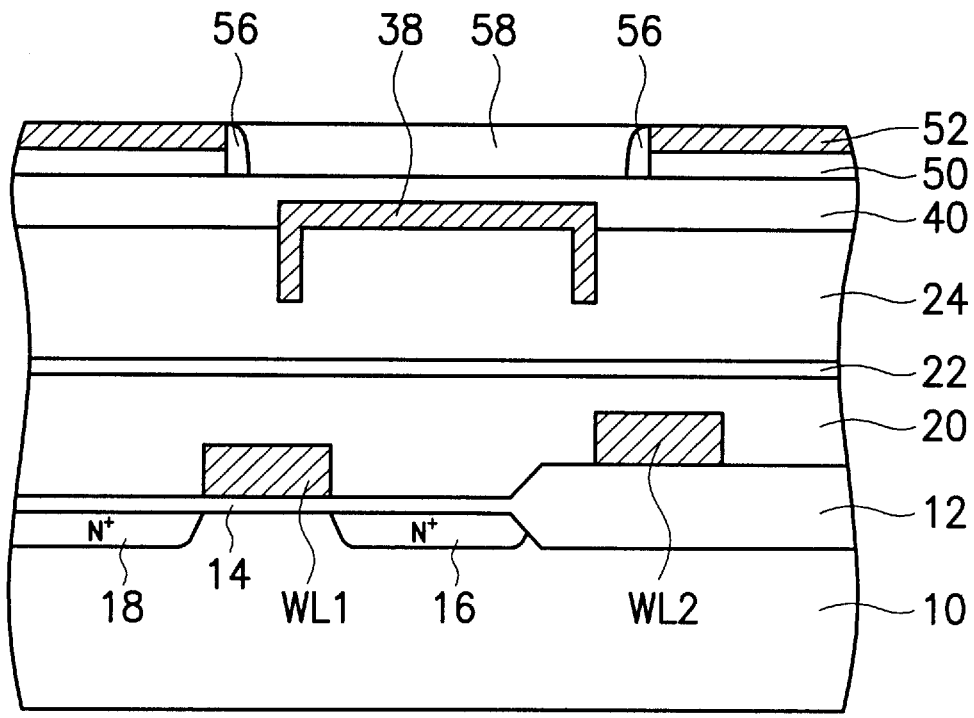

Referring next to FIG. 3B, in a subsequent step, silicon dioxide spacers 56 are formed on the sidewalls of the stacked structure (50, 52). In this embodiment, the silicon dioxide spacers 56 are formed by first depositing a layer of silicon dioxide to a thickness of, for example, about 1,000 Å and then etching the layer back. An insulating layer 58 is then formed, for example, by depositing silicon nitride by CVD over the wafer, to a thickness of, for example, about 2,000 Å. The insulating layer 58 substantially fills the recess 54. After that, the top surface of the wafer is subjected to CMP to polish away part of the insulating layer 58 until at least the top surface of the stacked structure (50, 52) is exposed.

Figure 3C:
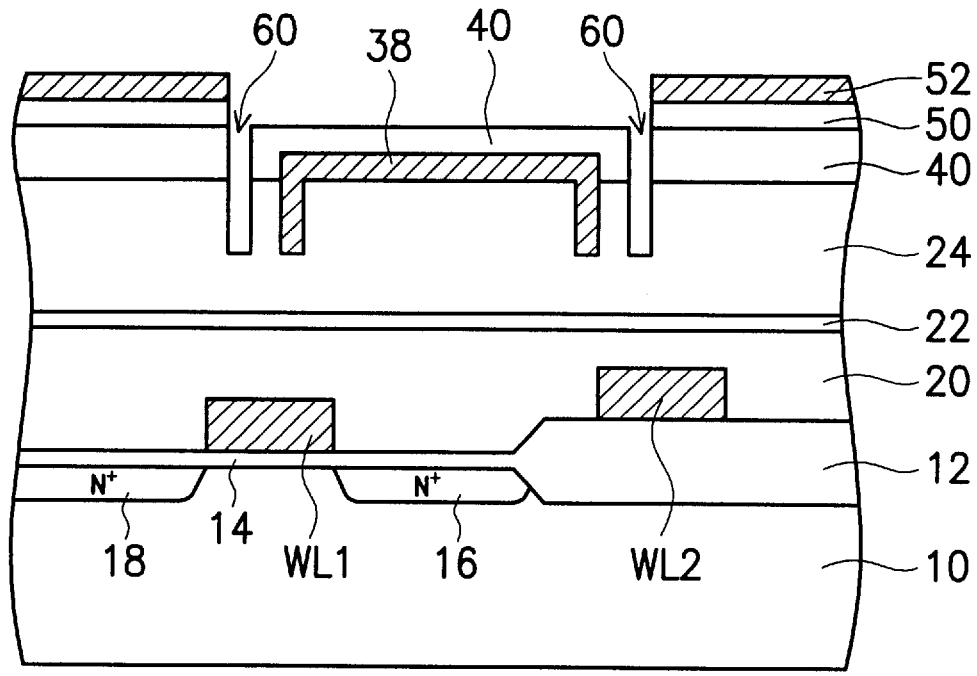

Referring next to FIG. 3C, using the stacked structure (50, 52) and the insulating layer 58 together as an etching mask, the wafer is etched to remove the silicon dioxide spacers 56. After the silicon dioxide spacers 56 are completely removed, the etching continues, still using the stacked structure (50, 52) and the insulating layer 58 together as an etching mask, to etch away portions of the insulating layer 58 that are located directly beneath the positions where the silicon dioxide spacers 56 were originally located. The etching is controlled to a predetermined depth to form cavities 60 in the insulating layer 58. It is to be noted that the depth of the cavities 60 can be arbitrarily adjusted, but the bottom of the cavities 60 should be a distance above the top surface of the etching protection layer 22. After the cavities 60 are fully formed, the wafer is further etched to remove the insulating layer 58 using the sacrificial polysilicon layer 52 as an etching mask.

Figure 3D:
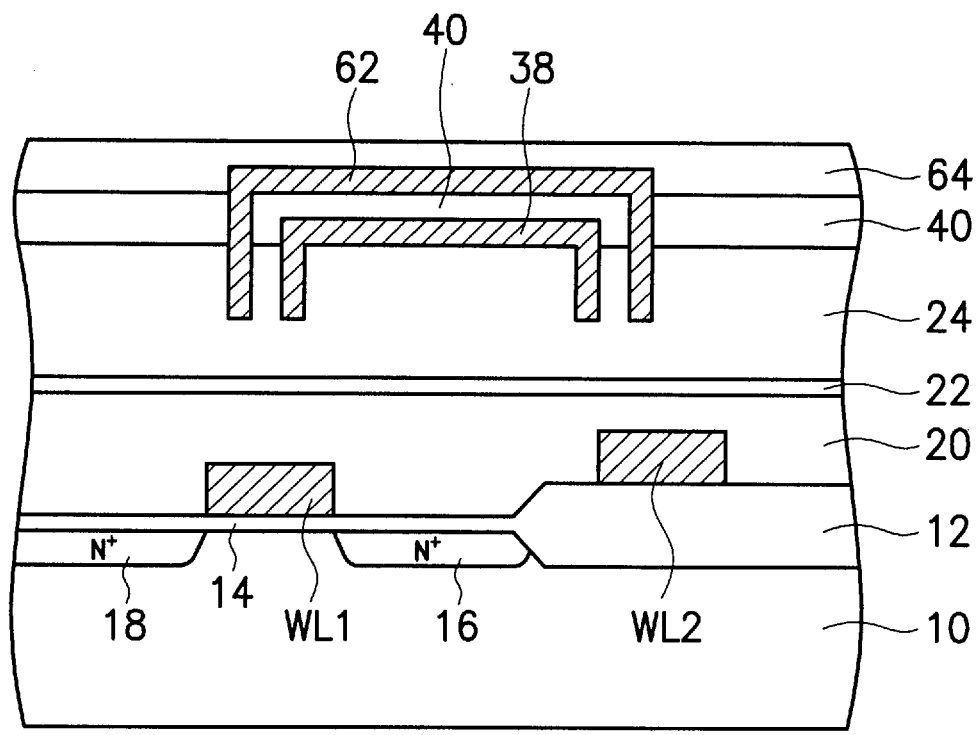

Referring to FIG. 3D, in a subsequent step, a polysilicon layer is deposited over both the stacked structure (50, 52) and the insulating layer 40 to a thickness of, for example, about 1,000 Å which substantially fills the cavity 60. The polysilicon layer can be diffused with arsenic ions, for example, to increase the conductivity thereof. After that, CMP is performed until at least the top surface of the insulating layer 50 is exposed. The remaining part of the polysilicon layer is indicated by the reference numeral 62 in FIG. 3D. Through this process, the sacrificial polysilicon layer 52 is removed. Then, using he polysilicon layer 62 and the insulating layer 40 together as an etching protection mask, wet etching is performed on the wafer to remove the insulating layer 50. The entire stacked structure (50, 52) is thereby removed. Then an insulating layer 64, such as a silicon dioxide layer, is deposited by CVD to a thickness of, for example, about 2,000 Å.

Figure 3E:
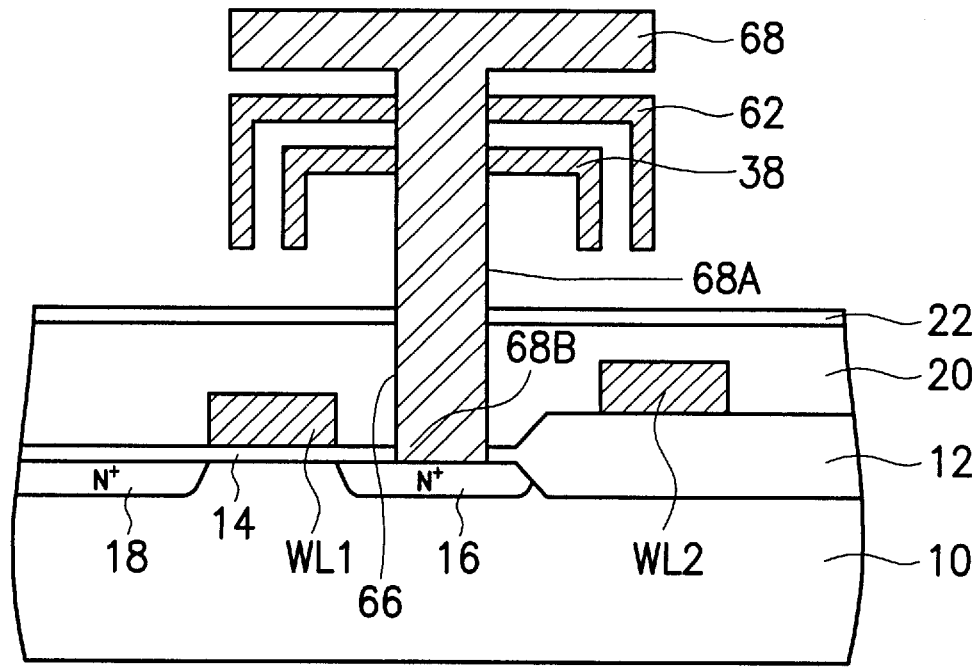

Referring next to FIG. 3E, a conventional photolithographic and etching process is next performed to form a storage electrode contact hole 66 through the insulating layer 64, the polysilicon layer 62, the insulating layer 40, the polysilicon layer 38, the insulating layer 24, the etching protection layer 22, the insulating layer 20, and the gate oxidation layer 14, to the top surface of the drain region 16. After that, a polysilicon layer 68 is deposited by CVD over the insulating layer 64 to fill the storage electrode contact hole 66 and cover the top surface of the insulating layer 64.

Subsequently, a further conventional photolithographic and etching process is performed on the wafer to define the location of the storage electrode for the data storage capacitor of the DRAM cell that is to be formed. After that, using the etching protection layer 22 as an etch end point, a wet etching process is performed on the wafer to entirely remove the silicon dioxide insulating layers 64, 40, and 24. This completes the fabrication of the storage electrode for the data storage capacitor of the DRAM cell.

As shown in FIG. 3E, the storage electrode includes a trunk-like polysilicon layer 68 which is substantially T-shaped in cross section, and two branch-like polysilicon layers 62 and 38 which each have two substantially L-shaped sections in cross section. The trunk-like polysilicon layer 68 has its root 68B (bottom end) electrically connected to the drain region 16 of the transfer transistor of the DRAM cell. The two sets of L-shaped branch-like polysilicon layers 62 and 38 each branch out sideways (horizontally, i.e., parallel to the substrate surface) from the upright portion 68A of the T-shaped trunk-like polysilicon layer 68, and then extend downward. All the subsequent steps are conventional steps to complete the fabrication of the DRAM cell, so that a description thereof need not be provided herein.

Third Embodiment

In the foregoing first and second preferred embodiments, each tree-type capacitor has a trunk-like portion which is substantially T-shaped in cross section. However, the invention is not limited to forming the trunk-like portion in such a shape. The trunk-like conductive layer can also be an upright pillar, as is described below.

Figure 4:
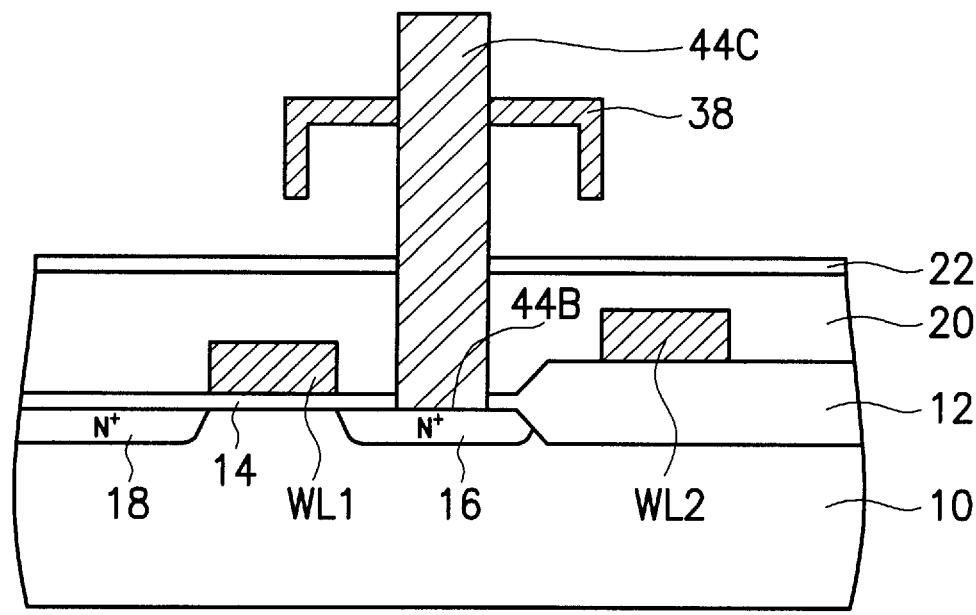
FIG. 4 is cross-sectional view depicting process steps for fabricating a semiconductor memory cell having a tree-type capacitor according to a third embodiment of the invention.

FIG. 4 shows a sectional diagram depicting the steps involved in a method for fabricating the third embodiment of the invention, which includes a tree-type capacitor having a pillar-shaped, trunk-like conductive layer. The tree-type capacitor of this embodiment is based on the structure of FIG. 2G. Elements in FIG. 4 that are identical in structure and purpose to those in FIG. 2G are labeled with the same reference numerals.

Referring to FIG. 4 together with FIG. 2G, upon completion of the structure shown in FIG. 2G, CMP is performed on the wafer to polish away the horizontal portion 44A of the polysilicon layer 44 until at least the top surface of the insulating layer 40 is exposed, leaving only the upright portion 44C of the polysilicon layer 44, which is substantially pillar-shaped. Wet etching is then performed using the etching protection layer 22 as an etch end point, to entirely remove the silicon dioxide insulating layers 40 and 24. This completes the fabrication of the storage electrode for the data storage capacitor of the DRAM cell. As shown in FIG. 4, the storage electrode includes a trunk-like polysilicon layer 44C which is substantially pillar-shaped, and a branch-like polysilicon layer 38 which has two sections substantially L-shaped in cross section. The pillar-shaped, trunk-like polysilicon layer 44C has its root 44B (bottom end) electrically connected to the drain region 16 of the transfer transistor of the DRAM cell. The L-shaped branch-like polysilicon layers 38 branch out sideways (perpendicular to the trunk-like layer 44C and parallel to the upper surface of the substrate 10) from the polysilicon layer 44C and then extend downward toward the substrate 10. All subsequent steps to complete the fabrication of the DRAM cell are conventional, so that such steps need not be further described.

In this third preferred embodiment, the pillar-shaped, trunk-like conductive layer 44C is formed using CMP. However, it can alternatively be formed by etching back to remove the horizontal portion 44A of the polysilicon layer 44 shown in FIG. 2G leaving the upright portion 44C. Another alternative way to form the pillar-shaped trunk-like conductive layer 44C is to epitaxially grow a polysilicon layer in the storage electrode contact hole 42. The grown epitaxial polysilicon layer then serves as the pillar-shaped, trunk-like conductive layer 44C.

Fourth Embodiment

In the foregoing first, second, and third embodiments, the trunk-like portion of each storage electrode is an integral element and each branch-like conductive layer, in sectional view, includes two L-shaped sections or offshoots from the upright portion of the trunk-like conductive layer.

However, the invention is not limited to such structures. A fourth exemplary embodiment includes a storage electrode having a trunk-like conductive layer consisting of two or more trunk-like segments and a branch-like conductive layer having two offshoots, one offshoot being substantially L-shaped in cross section (formed of one horizontal segment and one vertical segment) and the other offshoot consisting only of one horizontal segment.

FIGS. 5A through 5E are sectional views depicting the steps involved in a method for fabricating the fourth embodiment. The tree-type capacitor of the fourth embodiment is based on the structure of FIG. 2B. Elements in FIGS. 5A through 5E that are substantially identical in structure and purpose to those in FIG. 2B are labeled with the same reference numerals.

Figure 5A:
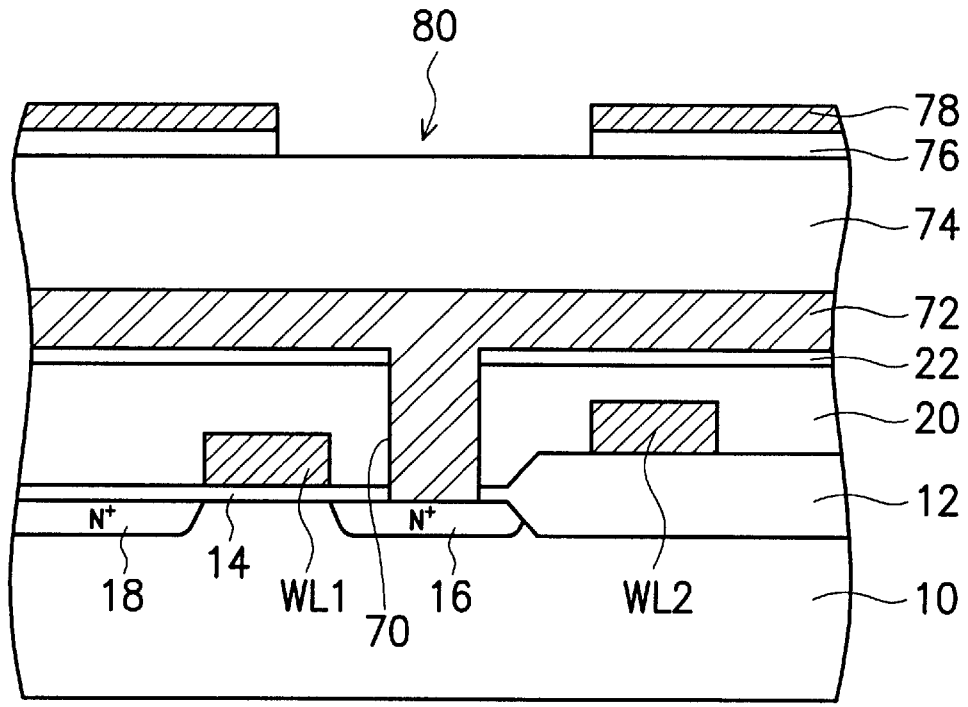
FIGS. 5A through 5E are cross-sectional views depicting process steps for fabricating a semiconductor memory cell having a tree-type capacitor according to a fourth embodiment of the invention.

Referring to FIG. 5A together with FIG. 2B, after completion of the structure of FIG. 2B, a conventional photolithographic and etching process is used to form a storage electrode contact hole 70 through the etching protection layer 22, the insulating layer 20, and the gate oxidation layer 14 to the top surface of the drain region 16. Then, a polysilicon layer 72 is deposited by CVD. The polysilicon layer 72 can be diffused with arsenic ions, for example, to increase the conductivity thereof. As shown in FIG. 5A, the polysilicon layer 72 fills the storage electrode contact hole 70 and covers the top surface of the etching protection layer 22. Next, a thick insulating layer 74 is formed, for example by depositing silicon dioxide over the polysilicon layer 72 to a thickness of, for example, about 7,000 Å. After that, an insulating layer and a sacrificial polysilicon layer are successively deposited over the insulating layer 74 by CVD. A conventional photolithographic and etching process is then performed on the wafer to remove selected parts of the insulating layer and the sacrificial layer. The remaining part of the insulating layer is indicated by the reference numeral 76, and the remaining part of the sacrificial polysilicon layer is indicated by the reference numeral 78, in FIG. 5A. The insulating layer 76 can be formed by depositing, for example, silicon nitride to a thickness of, for example, about 1,000 Å, and the sacrificial polysilicon layer 78 is deposited to a thickness of, for example, about 1,000 Å. The insulating layer 76 and the sacrificial polysilicon layer 78, in combination, form a stacked structure (76, 78) having a recess 80 therein. The recess 80 is substantially aligned vertically with one side (the left side in FIG. 5A) of the drain region 16.

Figure 5B:
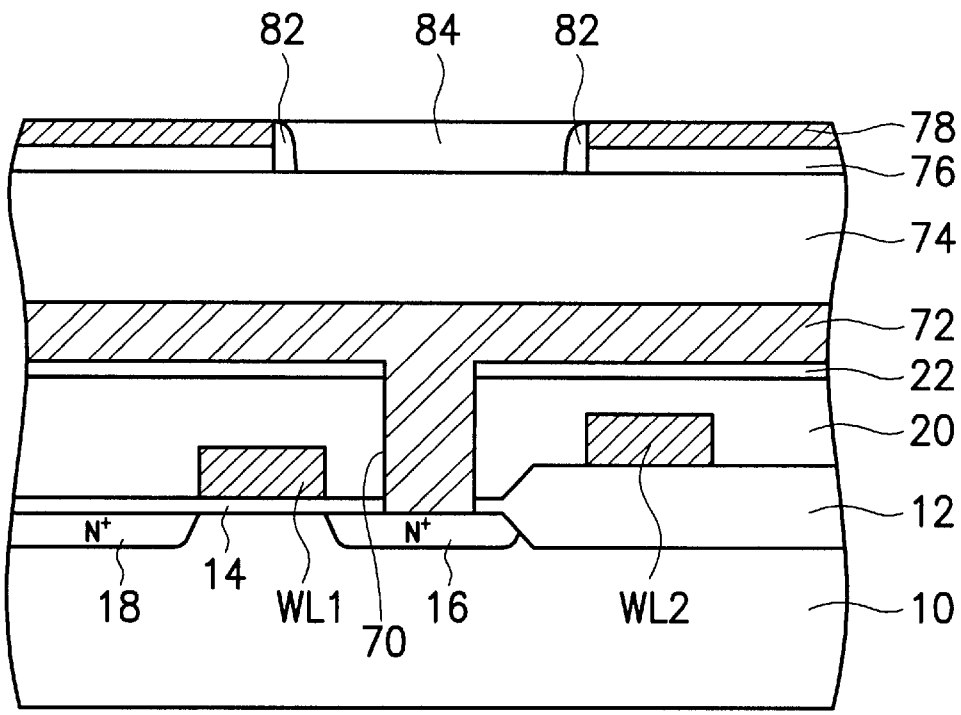

Referring next to FIG. 5B, silicon dioxide spacers 82 are then formed on the sidewalls of the stacked structure (76, 78). In this embodiment, the silicon dioxide spacers 82 are formed by first depositing a layer of silicon dioxide to a thickness of, for example, about 1,000 Å, and then etching the layer back. Next, an insulating layer 84 of, for example, silicon nitride, is deposited over the wafer by CVD to a thickness of, for example, about 2,000 Å. The insulating layer 84 substantially fills the recess 80. Then CMP is conducted on the insulating layer 84 until at least the top surface of the stacked structure (76, 78) is exposed.

Figure 5C:
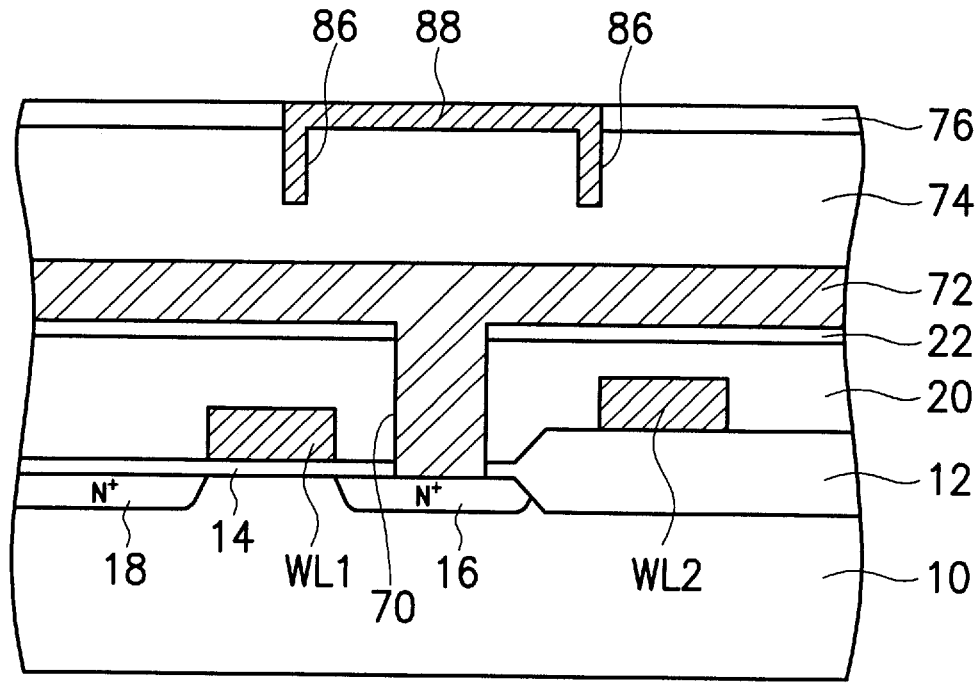

Referring next to FIG. 5C, using the stacked structure (76, 78) and the insulating layer 84 together as an etching mask, the wafer is etched to remove the silicon dioxide spacers 82. After the spacers 82 are completely removed, the etching continues, still using the stacked structure (76, 78) and the insulating layer 84 together as an etching mask, to etch away portions of the insulating layer 74 that are located directly beneath the positions where the spacers 82 were originally located. The etching is controlled to form cavities 86 of a predetermined depth in the insulating layer 74. It is to be noted that the depth of the cavities 86 can be arbitrarily adjusted, but the bottom of the cavities 86 should be a distance above the top surface of the polysilicon layer 72. Next, using the sacrificial polysilicon layer 78 as an etching mask, etching is performed to remove the insulating layer 84. Subsequently, a polysilicon layer is deposited over both the stacked structure (76, 78) and the insulating layer 74 to a thickness of, for example, about 1,000 Å, which substantially fills the cavities 86 and 80. The polysilicon layer can be diffused with arsenic ions, for example, to increase the conductivity thereof. Then CMP is performed until at least the top surface of the insulating layer 76 is exposed. The remaining part of the polysilicon layer is indicated by the reference numeral 88 in FIG. 5C. Through this process, the sacrificial polysilicon layer 78 is also removed.

Figure 5D:
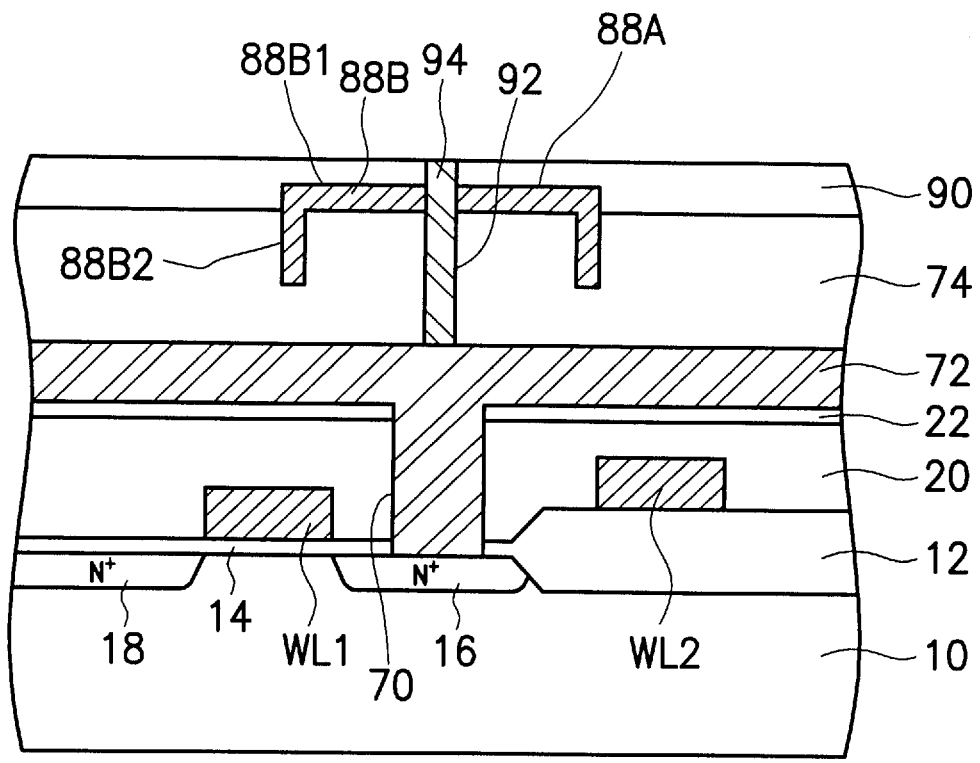

Referring next to FIG. 5D, using the polysilicon layer 88 and the insulating layer 74 together as an etching protection mask, wet etching is performed to remove the insulating layer 76. The entire stacked structure (76, 78) is thus removed by this process. An insulating layer 90 of, for example, silicon dioxide is then deposited by CVD, to a thickness of, for example, about 2,000 Å. A conventional photolithographic and etching process is next performed on the wafer to successively etch away selected parts of the insulating layer 90, the polysilicon layer 88, and the insulating layer 74, until the top surface of the polysilicon layer 72 is exposed, thereby forming a hole 92 and separating the polysilicon layer 88 into left and right L-shaped branches (offshoots) 88A and 88B. Subsequently, in the hole 92, a solid pillar-like polysilicon layer 94 is formed, for example, epitaxially or by a deposition and etching process.

Figure 5E:
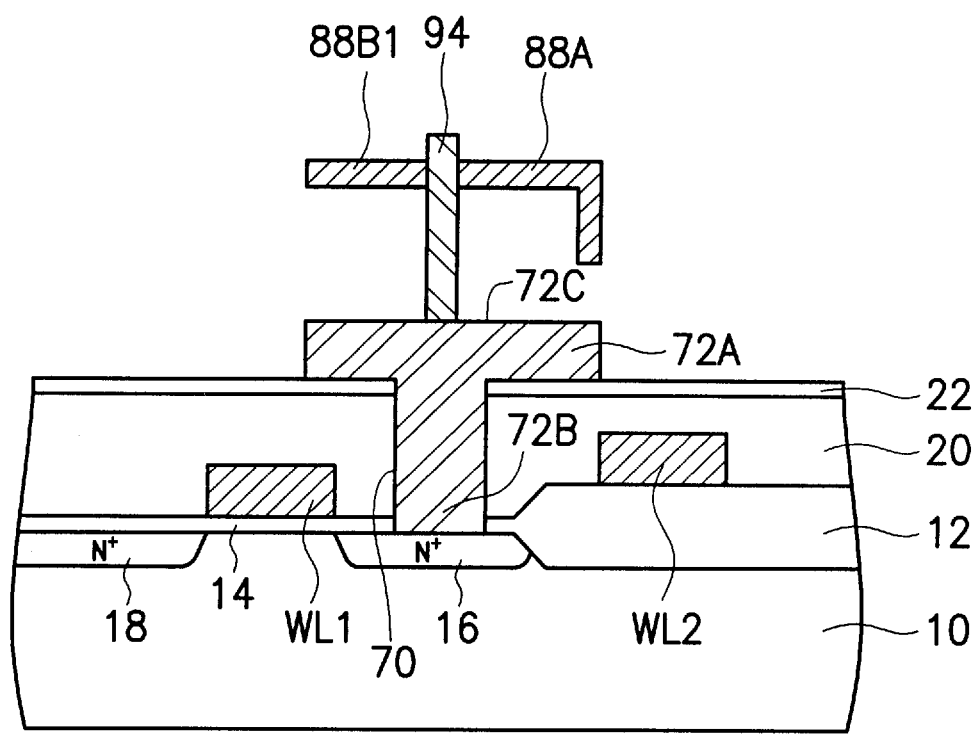

Referring now to FIG. 5E, a further conventional photolithographic and etching process is next performed on the wafer for selective removal of portions of the polysilicon layers 88 and 72, to define a storage electrode for the data storage capacitor of the DRAM cell that is to be formed. By this process, the vertical segment 88B2 of the left L-shaped branch 88B of polysilicon layer 88 is removed, leaving only its horizontal segment 88B1 as an offshoot. After that, using the etching protection layer 22 as an etch end point, the wafer is wet etched to remove the silicon dioxide insulating layers 90 and 74. This completes the fabrication of the storage electrode for the data storage capacitor of the DRAM cell. As shown in the drawing, the storage electrode includes a bottom trunk-like conductive layer 72A, a top trunk-like polysilicon layer 94 extending away from the bottom trunk-like conductive layer 72A, and a branch-like conductive layer consisting of a first offshoot 88A to the right which is substantially L-shaped in cross section, and a second offshoot 88B1 to the left which includes only a horizontal segment. The bottom trunk-like conductive layer 72A is substantially T-shaped in cross section and has its root 72B (bottom end) electrically connected to the drain region 16 of the transfer transistor of the DRAM cell. The top trunk-like polysilicon layer 94 is substantially pillar-shaped, extending upright from the top surface 72C of the bottom trunk-like conductive layer 72A. The branch-like polysilicon layer (88A, 88B1) branches out sideways from the top trunk-like polysilicon layer 94, that is, horizontally and substantially perpendicular to the layer 94.

Fifth Embodiment

Further to the foregoing four exemplary embodiments, the fifth embodiment has a tree-type capacitor which includes a storage electrode having L-shaped branch-like conductive layers together with horizontally extended branch-like conductive layers.

Moreover, in the foregoing fourth embodiment, the horizontal portion of the bottom trunk-like conductive layer 72A contacts the underlying etching protection layer 22. However, the invention is not so limited. The bottom surface of the horizontal portion of the bottom trunk-like conductive layer 72A can be separated from the underlying etching protection layer 22 by some distance in order to further increase the surface area of the storage electrode.

FIGS. 6A through 6E are sectional views depicting the steps involved in a method for fabricating a fifth preferred embodiment of the invention, in which the tree-type capacitor is based on the structure of FIG. 2B. Elements shown in FIG. 6A through 6E that are substantially identical in structure and purpose to those in FIG. 2B are labeled with the same reference numerals.

Figure 6A:
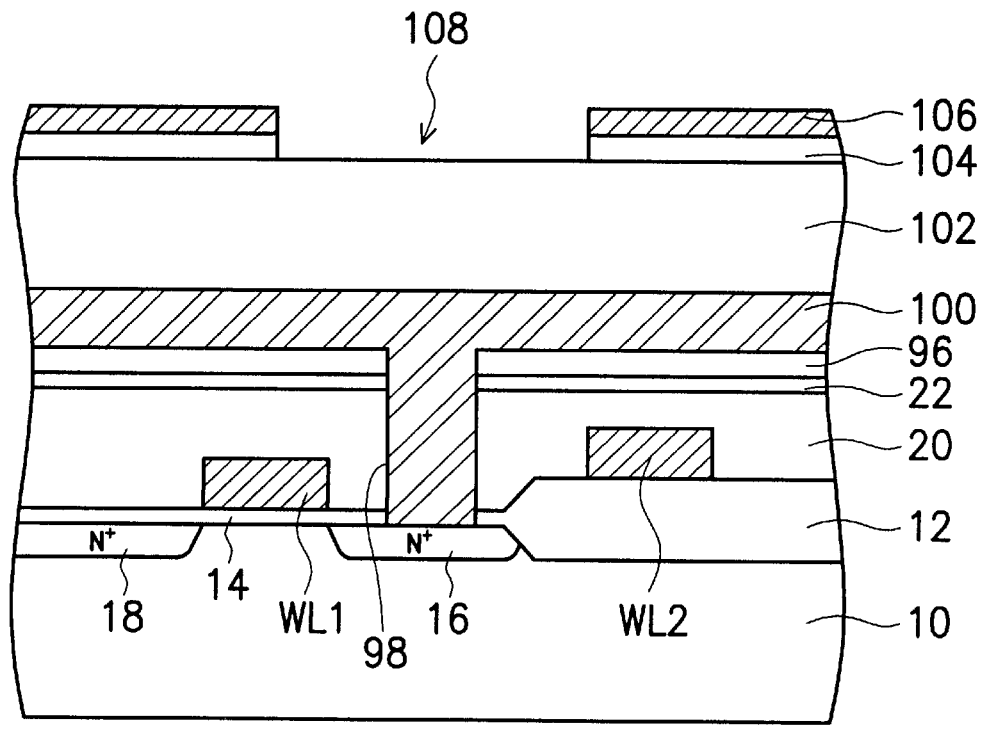
FIGS. 6A through 6E are cross-sectional views depicting process steps for fabricating a semiconductor memory cell having a tree-type capacitor according to a fifth embodiment of the invention.

Referring to FIG. 6A together with FIG. 2B, after completion of the structure of FIG. 2B, an insulating layer 96 is formed for example, by depositing, silicon dioxide by CVD over the etching protection layer 22, to a thickness of, for example, about 1,000 Å. A conventional photolithographic and etching process is then performed on the wafer so as to form a storage electrode contact hole 98 through the insulating layer 96, the etching protection layer 22, the insulating layer 20, and the gate oxidation layer 14, to the top surface of the drain region 16. Next, a polysilicon layer 100 is deposited by CVD over the insulating layer 96. The polysilicon layer 100 can be diffused with arsenic ions, for example, to increase the conductivity thereof. The polysilicon layer 100 fills the storage electrode contact hole 98 and covers the top surface of the insulating layer 96. Then, a thick insulating layer 102, of silicon dioxide, for example is deposited over the polysilicon layer 100 to a thickness of, for example, 7,000 Å. Next, an insulating layer and a sacrificial polysilicon layer are successively deposited over the insulating layer 102. Then a conventional photolithographic and etching process is performed to remove selected parts of the insulating layer and the sacrificial layer. The remaining part of the insulating layer is indicated by the reference numeral 104, and the remaining part of the sacrificial polysilicon layer is indicated by the reference numeral 106, in FIG. 6A. The insulating layer 104 can be a layer of silicon nitride having a thickness of, for example, about 1,000 Å and the sacrificial polysilicon layer 106 is deposited to a thickness of about 1,000 Å, for example. The insulating layer 104 and the sacrificial polysilicon layer 106, in combination, form a stacked structure (104, 106) having a recess 108 therein. The recess 108 is substantially vertically aligned with the drain region 16.

Figure 6B:
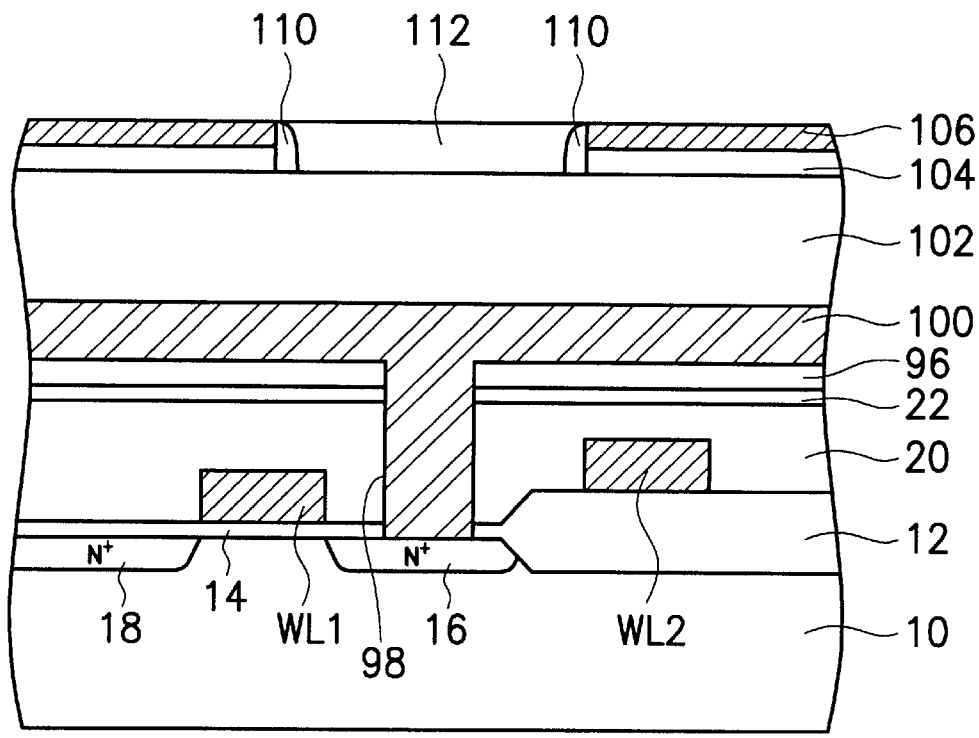

Referring next to FIG. 6B, silicon dioxide spacers 110 are then formed on the sidewalls of the stacked structure (104, 106). In this embodiment, the silicon dioxide spacers 110 are formed by first depositing a layer of silicon dioxide to a thickness of, for example about 1,000 Å, and then etching the layer back. An insulating layer 112 of, for example, silicon nitride, is then deposited by CVD to a thickness of, for example, about 2,000 Å. The insulating layer 112 substantially fills the recess 108. Next, CMP is performed on the top surface to polish away part of the insulating layer 112, until at least the top surface of the stacked structure (104, 106) is exposed.

Figure 6C:
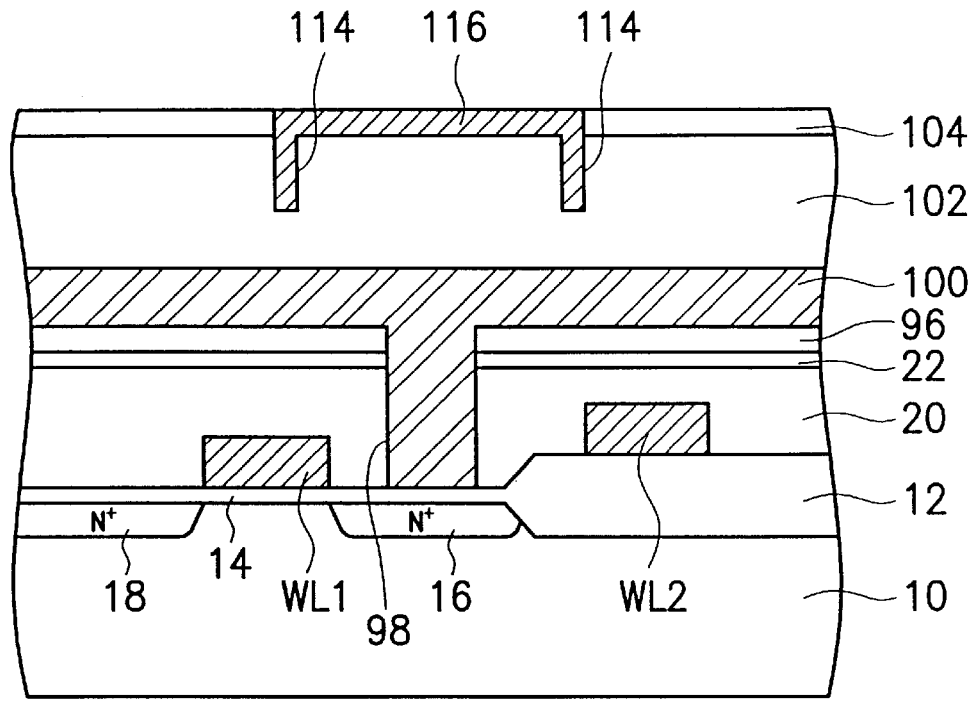

Referring next to FIG. 6C, using the stacked structure (104, 106) and the insulating layer 112 together as an etching mask, etching is performed to remove the silicon dioxide spacers 110. After the silicon dioxide spacers 110 are completely removed, the etching process continues, still using the stacked structure (104, 106) and the insulating layer 112 together as etching mask, to etch away the portions of the insulating layer 102 that are located directly beneath the positions where the silicon dioxide spacers 110 were originally located. The etching is controlled to a predetermined depth to form cavities 114 in the insulating layer 102. It is to be noted that the depth of the cavities 114 can be arbitrarily adjusted, but the bottom of the cavities 114 should be some distance above the top surface of the polysilicon layer 100. Then, using the sacrificial polysilicon layer 106 as an etching mask, etching is performed to remove the insulating layer 112. Subsequently, a polysilicon layer is deposited over the stacked structure (104, 106) and the insulating layer 102 to a thickness of, for example, about 1,000 Å, which substantially fills the cavities 114 and 108. The polysilicon layer can be diffused with arsenic ions, for example, to increase the conductivity thereof. Next, CMP is performed on the polysilicon layer until at least the top surface of the insulating layer 104 is exposed. The remaining part of the polysilicon layer is indicated by the reference numeral 116 in FIG. 6C. By this process, the sacrificial polysilicon layer 106 has been completely removed.

Figure 6D:
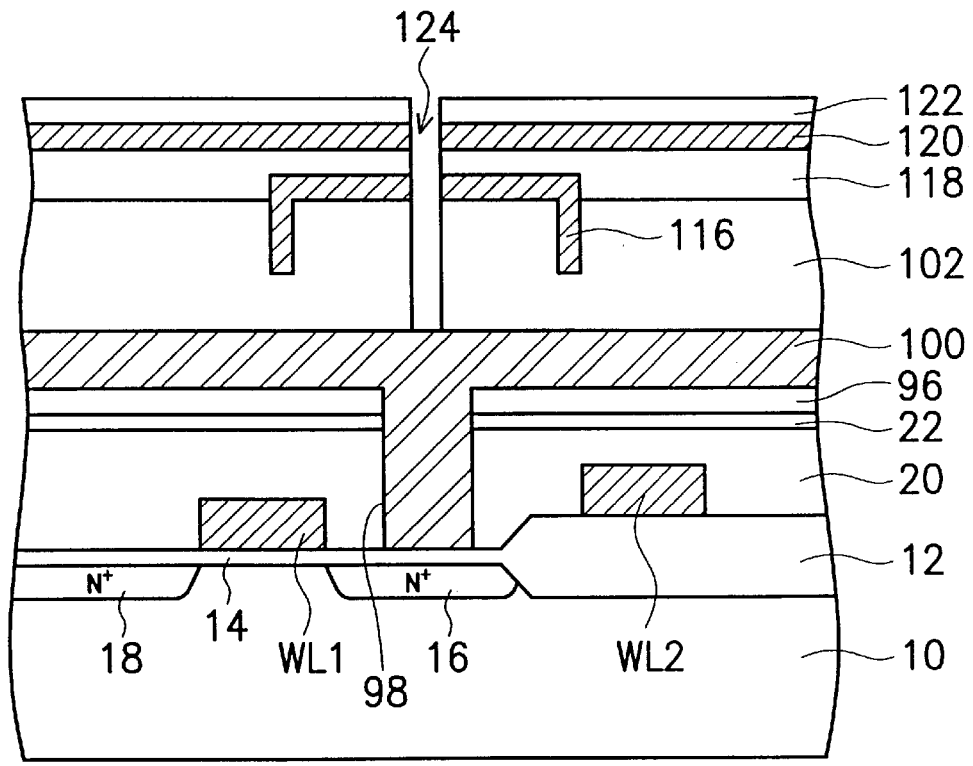

Referring next to FIG. 6D, using the polysilicon layer 116 and the insulating layer 102 together as an etching protection mask, the wafer is now wet etched to remove the insulating layer 104. The entire stacked structure (104, 106) is thus removed by this process. Then, CVD is used to deposit successively an insulating layer 118, a polysilicon layer 120, and an insulating layer 122. The insulating layer 118 can be formed of, for example silicon dioxide, to a thickness of, for example, about 2,000 Å, and similarly, the insulating layer 122 can be formed of silicon dioxide, for example, but to a thickness of only, for example, about 1,000 Å. The polysilicon layer 120 can be diffused with arsenic ions, for example, to increase the conductivity thereof. Then, using a conventional photolithographic and etching process, a hole 124 is formed in a selected position of the wafer that is substantially aligned with the drain region 16, by etching successively through the insulating layer 122, the polysilicon layer 120, the insulating layer 118, the polysilicon layer 116, and the insulating layer 102, until the top surface of the polysilicon layer 100 is exposed.

Figure 6E:
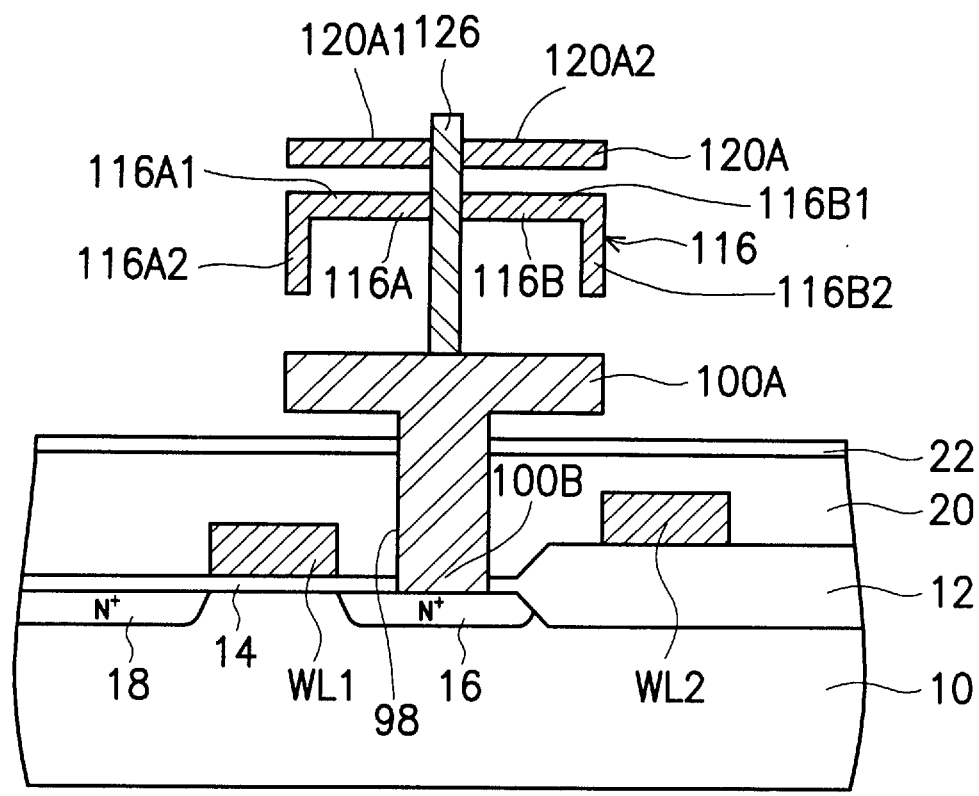

Referring next to FIG. 6E, a solid pillar-like polysilicon layer 126 is formed in the hole 124, for example, epitaxially or by a deposition and etch back process. Subsequently, a further conventional photolithographic and etching process is performed on the polysilicon layers 120 and 100 to reduce their horizontal dimensions and thereby define a storage electrode for the data storage capacitor of the DRAM cell, having branch-like polysilicon layers 120A and 116 and a bottom trunk-like polysilicon layer 100A. Then, using the etching protection layer 22 as an etch end point, wet etching is performed to entirely remove the exposed silicon dioxide insulating layers 122, 118, 102, and 96. This completes the fabrication of the storage electrode for the data storage capacitor of the DRAM cell.

As shown in FIG. 6E, this storage electrode includes the bottom trunk-like polysilicon layer 100A which is substantially T-shaped in cross section, a top trunk-like polysilicon layer 126 extending from the bottom trunk-like polysilicon layer 10A, and two branch-like polysilicon layers 120A and 116 of which the branch-like polysilicon layer 116 includes two offshoots 116A and 116B to either side that are each substantially L-shaped in cross section, and the branch-like polysilicon layer 120A also includes two offshoots 120A1 and 120A2 to either side but which are each substantially rectangular. The bottom trunk-like polysilicon layer 100A has its root 100B (bottom end) electrically connected to the drain region 16 of the transfer transistor of the DRAM cell, and the top trunk-like polysilicon layer 126 extends upwardly from the top of the bottom trunk-like polysilicon layer 100A. The two branch-like polysilicon layers (116A and 116B) and 120 each branch out sideways, that is, horizontally and substantially perpendicularly to the top trunk-like polysilicon layer 126. The branch-like polysilicon layer 120A has two horizontal flat segments 120A1 and 120A2 extending horizontally to either side, and the branch-like polysilicon layer 116 has two L-shaped portions (116A, 116B), each of which includes a first segment (respectively 116A1 and 116B1) extending horizontally from either side and a second segment (respectively 116A2 and 116B2) extending downwardly therefrom.

Sixth Embodiment

In the sixth embodiment, various structures for the trunk-like and branch-like elements from the first and the fifth embodiments are utilized in combination.

Figure 7:
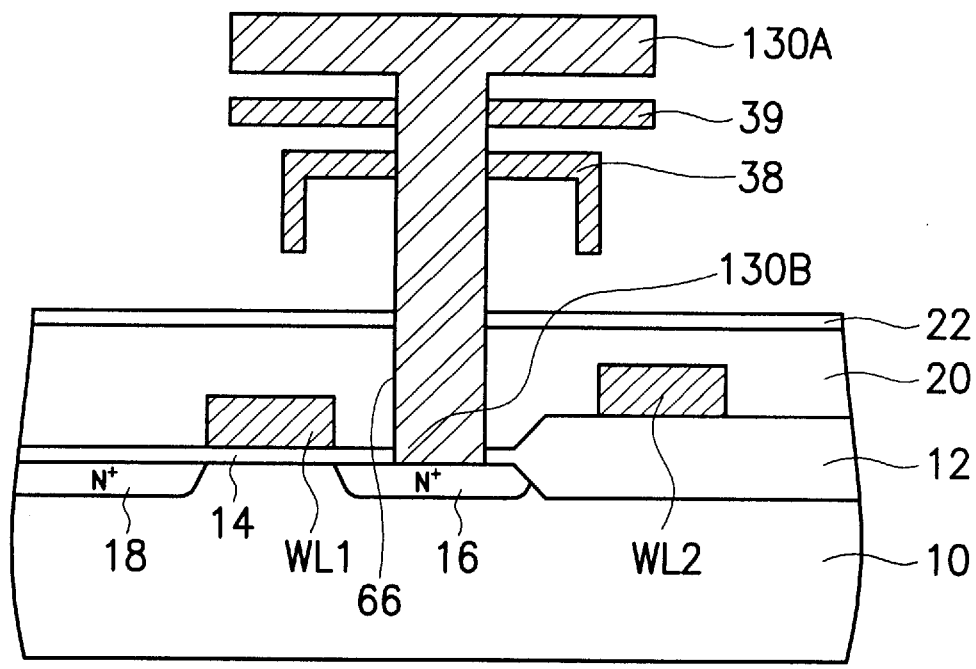
FIG. 7 is a cross-sectional view depicting a semiconductor memory cell having a tree-type capacitor according to a sixth embodiment of the invention.

FIGS. 7 is a cross sectional view of a tree-type storage electrode according to a fifth preferred embodiment of the invention, in which the tree-type capacitor is based on the structure of FIG. 2F. Elements shown in FIG. 7 that are substantially identical in structure and purpose to those in FIG. 2F are labeled with the same reference numerals.

Then, CVD is used to deposit a polysilicon layer 39 and an insulating layer (not shown) above the polysilicon layer 39. The insulating layer on the polysilicon layer 39 can be formed of silicon dioxide, for example, but to a thickness of only, for example, about 1,000 Å. The polysilicon layer 39 can be diffused with arsenic ions, for example, to increase the conductivity thereof. Then, a polysilicon layer 130A and its root 130B are formed, using the processes similar to the ones for forming the polysilicon layer 44A and its root 44B. Therefore, the trunk-like polysilicon layer 130A penetrates the polysilicon layers 39 and 38; its root 44B is electrically connected to the drain region 16 of the transfer transistor of the DRAM cell.

From the foregoing descriptions of the preferred embodiments of the invention, it will be apparent to those skilled in the art of semiconductor technology that the various structures for the trunk-like and branch-like elements can be utilized either individually or in further various combinations and various numbers, to form a tree-type capacitor. Such arrangements are to be considered within the scope of the invention.

In addition, although in the foregoing description of the preferred embodiments, the drain of the transfer transistor is based on a diffused region in a silicon substrate, the invention is not limited to such a semiconductor structure. Other structures for the drain region, such as a trench-type drain region, may also be used and are within the scope of the invention.

Further, all the elements in the accompanying drawings are drawn schematically for demonstrative purposes only and therefore not to the actual scale. Such illustrated dimensions therefore should by no means be considered limitations to the scope of the invention.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method of fabricating a semiconductor memory device on a substrate having a transfer transistor formed thereon, comprising:

a. forming a first insulating layer over the transfer transistor;

b. forming an etching protection layer over the first insulating layer;

c. forming a second insulating layer over the etching protection layer;

d. forming a stacked layer over the second insulating layer, wherein the stacked layer has a recess therein disposed above a source/drain region of the transistor and exposing a portion of the second insulating layer;

e. forming a third insulating layer around the periphery of the recess;

f. forming a fourth insulating layer to fill the recess;

g. removing the third insulating layer and the fourth insulating layer from the recess, and removing a portion of the second insulating layer directly below the third insulating layer to form a cavity, wherein the cavity does not expose the etching protection layer;

h. forming a first conductive layer to fill the recess and the cavity;

i. removing the stacked layer;

j. forming a fifth insulating layer above the second insulating layer and the first conductive layer;

k. forming a second conductive layer over the fifth insulating layer, wherein the second conductive layer penetrates the fifth insulating layer, the first conductive layer, the second insulating layer, the etching protection layer, and the first insulating layer, and is in electrical contact with the source/drain region;

l. removing a portion of the second conductive layer to form a trunk-like conductive layer, wherein the first conductive layer forms a branch-like conductive layer in cross section, and the trunk-like and branch-like conductive layers together comprising a storage electrode of a storage capacitor;

m. removing the second and fifth insulating layers;

n. forming a dielectric laser on exposed surfaces of at least the first and second conductive layers; and o. forming a third conductive layer on a surface of the dielectric layer to form an opposing electrode.

2. A method as claimed in claim 1, wherein the trunk-like conductive layer is T-shaped in cross section.

3. A method as claimed in claim 1, wherein the trunk-like conductive layer forms as a substantially solid pillar.

4. A method as claimed in claim 3, wherein step (l) comprises using a chemical mechanical polishing technique to remove the second conductive layer above the fifth insulating layer until the fifth insulating layer is exposed.

5. A method as claimed in claim 3, wherein step (l) comprises using an etching technique to remove the portion of the second conductive layer.

6. A method as claimed in claim 3, further comprising the steps of:

forming a sixth insulating layer after said step (i); and forming a fifth conductive layer on the sixth insulating layer;

wherein:

step (k) further includes forming the third conductive layer to penetrate the fifth conductive layer, and the sixth insulating layer; and step (l) further includes patterning the fifth conductive layer to be a part of the branch-like conductive layer;

step (m) further includes removing the sixth insulating layer; and step (n) further includes forming the dielectric layer on an exposed surface of the fifth conductive layer.

7. A method as claimed in claim 6, wherein the fifth conductive layer is straight stick-shaped in cross section and connected to the trunk-like conductive layer.

8. A method as claimed in claim 1, wherein the branch-like conductive layer has at least one L-shaped portion in cross section.

9. A method as claimed in claim 1, wherein the branch-like conductive layer includes a first segment and a second segment, wherein the first segment is electrically connected to the trunk-like conductive layer and extends therefrom substantially parallel to an upper surface of the substrate, and the second segment is electrically connected to the first segment and extends therefrom towards the upper surface of the substrate.

10. A method as claimed in claim 1, wherein step (d) includes:

forming a first film on the second insulating layer and then forming a second film on the first film, wherein the first film is an insulating film and the second film is a conductive film; and patterning the first film and the second film to form the stacked layer and the recess therein.

11. A method as claimed in claim 1, further comprising:

forming a sixth insulating layer over the first conductive layer after said step (i); and forming a fourth conductive layer over the sixth insulating layer;

wherein:

step (k) further includes forming the second conductive layer to penetrate the fourth conductive layer and the six insulating layer;

step (l) further includes patterning the fourth conductive layer to be a part of the branch-like conductive layer;

step (m) further includes removing the sixth insulating layer; and step (n) further includes forming the dielectric layer on an exposed surface of the fourth conductive layer.

12. A method as claimed in claim 11, wherein the fourth conductive layer is stick-shaped in cross section and connected to the trunk-like conductive layer.

13. A method as claimed in claim 1, wherein said step (d) further comprises the steps of:

forming a first film on the second insulating layer and then a second film on the first film, wherein the first film is an insulating film and the second film is a conductive film; and patterning the first film and the second film to form the stacked layer and the recess therein.

14. A method of fabricating a semiconductor memory device on a substrate, having a transfer transistor formed thereon, comprising:

a. forming a first insulating layer over the transfer transistor;

b. forming an etching protection layer over the first insulating layer;

c. forming a second insulating layer over the etching protection layer;

d. forming a first stacked layer over the second insulating layer, wherein the first stacked layer has a first recess therein disposed above a source/drain region of the transistor and exposing a portion of the second insulating layer;

e. forming a third insulating layer around the periphery of the first recess;

f. forming a fourth insulating layer to fill the first recess;

g. removing the third insulating layer and the fourth insulating layer from the first recess, and removing a portion of the second insulating layer directly below the third insulating layer to form a first cavity, wherein the first cavity does not expose the etching protection layer;

h. forming a first conductive layer to fill the first recess and the first cavity;

i. removing the first stacked layer;

j. forming a sixth insulating layer;

k. forming a second stacked layer over the sixth insulating layer, wherein the second stacked layer has a second recess therein disposed above the source/drain region and exposing a portion of the sixth insulating layer;

l. forming a seventh insulating layer around a periphery of the second recess;

m. forming an eighth insulating layer to fill the second recess;

n. removing the seventh insulating layer, the eighth insulating layer, and a portion of the sixth insulating layer directly below the seventh insulating layer to form an second cavity, wherein the second cavity does not expose the etching protection layer;

o. forming a fourth conductive layer to fill the second recess and the second cavity;

p. removing the second stacked layer;

q. forming a fifth insulating layer over the fourth insulating layer and the fourth conductive layer;

r. forming a second conductive layer over the fifth insulating layer, wherein the second conductive layer penetrates the fifth insulating layer, the fourth conductive layer, the sixth insulating layer, the first conductive layer, the second insulating layer, the etching protection layer, and the first insulating layer, and is in electrical contact with the source/drain region;

s. removing a portion of the second conductive layer to form a trunk-like conductive layer, wherein first and fourth conductive layers form branch-like conductive layers in cross section which are substantially parallel to each other and are each connected to the trunk-like conductive layer, and the trunk-like and branch-like conductive layers together comprise a storage electrode of a storage capacitor;

t. removing the second, fifth and sixth insulating layers;

u. forming a dielectric layer on exposed surfaces of at least the first, second and fourth conductive layers; and v. forming a third conductive layer on a surface of the dielectric layer to form an opposing electrode.

15. A method as claimed in claim 14, wherein the trunk-like conductive layer is T-shaped in cross section.

16. A method as claimed in claim 14, wherein the trunk-like conductive layer forms as a substantially solid pillar.

17. A method as claimed in claim 16, wherein step (s) includes using a chemical mechanical polishing technique to remove a portion of the second conductive layer until the fifth insulating layer is exposed.

18. A method as claimed in claim 16, wherein step (s) includes using an etching technique to remove the portion of the second conductive layer over the fifth insulating layer.

19. A method as claimed in claim 14, wherein each of the branch-like conductive layers has at least one L-shaped portion in cross section.

20. A method as claimed in claim 14, wherein each of the branch-like conductive layers includes a first segment and a second segment, wherein the first segment is electrically connected to the trunk-like conductive layer and extends therefrom substantially parallel to an upper surface of the substrate, and the second segment is electrically connected to the first segment and extends therefrom towards the upper surface of the substrate.

21. A method of fabricating a semiconductor memory device on a substrate, having a transfer transistor formed thereon, the method comprising:

a. forming a first insulating layer over the transfer transistor;

b. forming a first conductive layer which penetrates at least the first insulating layer and is in electrical contact with a source/drain region of the transfer transistor;

c. forming a second insulating layer over the first conductive layer;

d. forming a stacked layer over the second insulating layer and having a recess therein which exposes a portion of the second insulating layer;

e. forming a third insulating layer around the periphery of the recess;

f. forming a fourth insulating layer to fill the recess;

g. removing the third and fourth insulating layers from the recess, and removing a portion of the second insulating layer directly below the third insulating layer to form a cavity, wherein the cavity does not expose the first conductive layer;

h. forming a second conductive layer to fill the recess and the cavity;

i. removing the stacked layer;

j. forming a fifth insulating layer above the second insulating layer and the second conductive layer;

k. forming a third conductive layer which penetrates at least the fifth insulating layer, the second conductive layer, and the second insulating layer, and is in electrical contact with the first conductive layer;

l. patterning the first conductive layer, wherein the first and third conductive layers form a trunk-like conductive layer, the second conductive layer forms a branch-like conductive layer, and the trunk-like and branch-like conductive layers comprise a storage electrode of a storage capacitor;

m. removing the second and fifth insulating layers;

n. forming a dielectric layer on exposed surfaces of the first, second and third conductive layers; and o. forming a fourth conductive layer over the dielectric layer to form an opposing electrode of the storage capacitor.

22. A method as claimed in claim 21, wherein the trunk-like conductive layer includes a bottom trunk-like portion which is electrically connected to the source/drain region and an top trunk-like portion which is electrically connected to the bottom trunk-like portion and extends substantially away from the substrate.

23. A method as claimed in claim 22, wherein the bottom trunk-like portion is T-shaped in cross section.

24. A method as claimed in claim 23, wherein the top trunk-like portion is straight stick-shaped in cross section.

25. A method as claimed in claim 23, wherein the top trunk-like portion forms as a substantially solid pillar.

26. A method as claimed in claim 25, wherein said step (l) further includes using a chemical mechanical polish technique to remove a portion of the third conductive layer until the fifth insulating layer is exposed.

27. A method as claimed in claim 25, said step (l) further includes using an etching technique to remove a portion of the third conductive layer until the second conductive layer is exposed.

28. A method as claimed in claim 21, wherein the branch-like conductive layer is L-shaped in cross section.

29. A method as claimed in claim 21, wherein the branch-like second conductive layer includes a first segment and a second segment, wherein the first segment is electrically connected to the trunk-like conductive layer and extends substantially parallel to the upper surface of the substrate and the second segment is electrically connected to the first segment and extends towards the substrate.

30. A method as claimed in claim 21, wherein said step (l) further comprises patterning the second conductive layer so that the branch conductive layer includes a straight segment which is electrically connected to the trunk-like conductive layer and extends substantially parallel to the upper surface of the substrate.

31. A method as claimed in claim 21, further comprising the step of forming an etching protection layer on the first insulating layer between step (a) and step (b).

32. A method as claimed in claim 21, further comprising the steps of:

forming an etching protection layer on the first insulating layer after step (a); and forming a seventh insulating layer on the etching protection layer before step (b);

wherein:

in step (b), the first conductive layer further penetrates the etching protection layer and the seventh insulating layer, and said step (m) further includes removing the seventh insulating layer.

33. A method of fabricating a semiconductor memory device on a substrate, having a transfer transistor formed thereon, the method comprising:

a. forming a first insulating layer over the transfer transistor;

b. forming a first conductive layer which penetrates at least the first insulating layer and is in electrical contact with a source/drain region of the transfer transistor;

c. forming a second insulating layer over the first conductive layer;

d. forming a first stacked layer over the second insulating layer and having a recess therein which exposes a portion of the second insulating layer;

e. forming a third insulating layer around the periphery of the recess;

f. forming a fourth insulating layer to fill the recess;

g. removing the third and fourth insulating layers from the recess, and removing a portion of the second insulating layer directly below the third insulating layer to form a cavity, wherein the cavity does not expose the first conductive layer;

h. forming a second conductive layer to fill the recess and the cavity;

i. removing the first stacked layer;

c'. forming a fifth insulating layer over the second conductive layer;

d'. forming a second stacked layer over the fifth insulating layer having a recess therein which exposes a portion of the fifth insulating layer;

e'. forming a sixth insulating layer around a periphery of the recess;

f'. forming an seventh insulating layer to fill the second recess;

g'. removing the sixth and seventh insulating layers from the recess, and removing a portion of the second and fifth insulating layers directly below the sixth insulating layer to form a cavity, wherein the cavity does not expose the first or second conductive layers;

h'. forming a third conductive layer to fill the second recess and the second cavity;

i'. removing the second stacked layer;

j. forming a eight insulating layer above the third conductive layer and the fifth insulating layer;

k. forming a fourth conductive layer which penetrates at least the eighth insulating layer, the third conductive layer, the fifth insulating layer, the second conductive layer, and the second insulating layer, and is in electrical contact with the first conductive layer;

l. patterning the conductive layers, wherein the first and fourth conductive layers form trunk-like conductive layers, the second and third conductive layers form branch-like conductive layers, and the trunk-like and branch-like conductive layers comprise a storage electrode of a storage capacitor;

m. removing the second, fifth and eighth insulating layers;

n. forming a dielectric layer on exposed surfaces of the first, second, third and fourth conductive layers; and o. forming a fifth conductive layer over the dielectric layer to form an opposing electrode of the storage capacitor.

34. A method as claimed in claim 33, wherein at least one of the branch-like conductive layers has an L-shape in cross section.

35. A method as claimed in claim 33, wherein each of the branch-like conductive layers includes a first segment and a second segment, wherein the first segment is electrically connected to a trunk-like conductive layer and extends substantially parallel to an upper surface of the substrate, and the second segment is electrically connected to the first segment and extends in a direction towards the substrate.

36. A method as claimed in claim 33, wherein step (l) includes patterning the second and third conductive layers so that each of the branch-like conductive layers includes a straight segment which is electrically connected to a trunk-like conductive layer and extends substantially parallel to an upper surface of the substrate.

37. A method as claimed in claim 33, further comprising the steps of:

after step i', forming a ninth insulating layer after removing the second stacked layer; and forming a sixth conductive layer on the ninth insulating layer;

wherein:

step (k) includes forming the fourth conductive layer to further penetrate the sixth conductive layer and the ninth insulating layer;

step (l) further includes patterning the sixth conductive layer to be a further branch-like conductive layer;

step (m) further includes removing the ninth insulating layer; and step (n) further includes forming the dielectric layer on an exposed surface of the sixth conductive layer.

38. A method as claimed in claim 37, the sixth conductive layer has a stick shape in cross section and is electrically connected to a trunk-like conductive layer.

39. A method as claimed in claim 33, further comprising forming an etching protection layer on the first insulating layer after step (a).

40. A method as claimed in claim 33, further comprising:

forming an etching protection layer on the first insulating layer after step (a); and forming a ninth insulating layer on the etching protection layer;

wherein:

in step (b), the first conductive layer further penetrates the etching protection layer and the ninth insulating layer, and step (m) further includes removing the ninth insulating layer.

* * * * *